United States Patent [19]
Oshida et al.

[11] Patent Number: 5,302,999
[45] Date of Patent: Apr. 12, 1994

[54] ILLUMINATION METHOD, ILLUMINATION APPARATUS AND PROJECTION EXPOSURE APPARATUS

[75] Inventors: Yoshitada Oshida, Fujisawa; Tutomu Tawa, Katsuta; Yukihiro Shibata, Yokohama; Shigemi Ishii, Ibaraki; Minori Noguchi, Yokohama; Tsuneo Terasawa, Ome; Makoto Murayama, Fujisawa, all of Japan

[73] Assignee: Hitachi, Ltd., Tokyo, Japan

[21] Appl. No.: 9,928

[22] Filed: Jan. 27, 1993

[30] Foreign Application Priority Data

Feb. 4, 1992 [JP] Japan .................... 4-018676
Jul. 13, 1992 [JP] Japan .................... 4-184962

[51] Int. Cl.⁵ .................................... G03B 27/00
[52] U.S. Cl. .................................... 355/1; 355/53; 355/77
[58] Field of Search .............. 355/1, 53, 67, 77; 385/90, 25, 26, 43, 42, 75

[56] References Cited

U.S. PATENT DOCUMENTS

| | | | |
|---|---|---|---|
| 2,982,175 | 5/1961 | Eisler | 355/1 |
| 3,560,085 | 2/1971 | Silverberg | 355/1 |
| 4,118,123 | 10/1978 | Spence-Bate et al. | 355/1 X |
| 5,075,716 | 12/1991 | Jehan et al. | 355/1 |
| 5,091,744 | 2/1992 | Omata | 355/53 |
| 5,144,362 | 9/1992 | Kamon et al. | 355/53 |
| 5,150,173 | 9/1992 | Isobe et al. | 355/53 |
| 5,159,483 | 10/1992 | Watanabe et al. | 359/210 |
| 5,168,021 | 12/1992 | Arai et al. | 355/53 X |

FOREIGN PATENT DOCUMENTS 61-91662  9/1986  Japan .

Primary Examiner—Richard A. Wintercorn
Attorney, Agent, or Firm—Antonelli, Terry, Stout & Kraus

[57] ABSTRACT

A projection exposure apparatus comprises a light source for emitting a light beam for exposure; an illumination optical system comprising optical fiber bundle portion including a plurality of bundled optical fibers having an entrance plane to which a light beam exiting from the exposing light source is incident, and a little optical fiber bundle portion including a plurality of little optical fiber bundles respectively having an outgoing plane; and an projection exposure system for projecting a light beam passing through the illumination optical system and transmitting a mask or a reticle onto an object to be exposed as a pattern image of the mask or the reticle.

32 Claims, 36 Drawing Sheets

$\sigma = \dfrac{d}{D}$

D > d

Ⓗ > θ

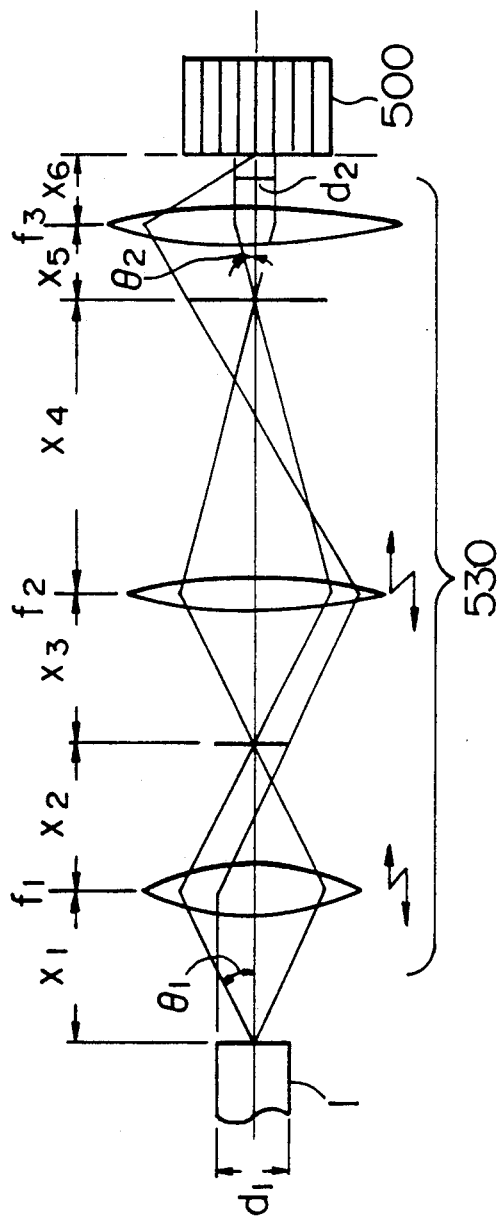
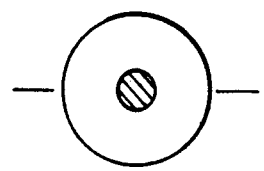
FIG. 35A
FIG. 35B

ILLUMINATION METHOD, ILLUMINATION APPARATUS AND PROJECTION EXPOSURE APPARATUS

BACKGROUND OF THE INVENTION

The present invention relates to methods and apparatus for exposure illumination for use in projection exposure apparatus for producing semiconductor chips, and more particularly, to projection exposure apparatus, illumination methods and illumination apparatus which control the directivity of illuminating light in accordance with the size and shape of a pattern to be exposed or detected as well as the kind of a mask, a reticle or a wafer, so as to allow a pattern to be exposed or detected in an appropriate condition.

Patterns of semiconductor integrated circuits tending to be increasingly fine have advanced to an extent that the pattern width approaches to the wavelength of light. Although exposing methods using X-rays or electron rays in place of light beams have been developed, these methods are inferior in mass productivity as compared with the light exposing method which allows a large number of integrated circuit chips to be exposed for a short time, particularly for producing memories and so on which are in great demand, and therefore encounter difficulties in mass-producing inexpensive memories. In such circumstances, techniques have been developed in recent years for providing a mask or a reticle used in a conventional i-line reduction projection exposure apparatus (i-line stepper) with a phase shift portion so as to significantly improve the resolution of a pattern as compared with a conventionally used normal reticle. Further, a technique, as described in JP-A-61-91662, has been developed for improving the resolution of patterns, even without employing such a special reticle, by forming an ring-shaped light beam for illuminating a reticle on an entrance pupil of a reduction projection lens so as to have high spatial frequency spectrum of the light transmitting the reticle pass through an entrance pupil of an imaging lens for exposure.

When a method of improving the resolution of patterns as described above is to be employed, if a conventionally used semiconductor exposure apparatus (i-line stepper) is used as it is, a problem arises that a so-called $\sigma$ value indicative of the illumination directivity of a light beam illuminating a reticle ($\sigma$=the ratio of extension of illuminating light on a pupil of an imaging lens for exposure to the diameter of the pupil of the lens) does not coincide with the $\sigma$ value indicative of the illumination directivity optimal to the resolution improving method.

SUMMARY OF THE INVENTION

To solve the above problem inherent to the prior art, it is an object of the present invention to provide projection exposure apparatus, illumination methods and illumination apparatus which are capable of readily selecting and controlling illuminating light optimal to each of various resolution improving methods and utilizing exposing light emitted from an exposing light source without wasting it.

Specifically, the present invention provides a projection exposure apparatus which is characterized by comprising a light source for emitting a light beam for exposure; an illumination optical system comprising optical fiber bundle portion including a plurality of bundled optical fibers having an entrance plane to which a light beam emitted from the exposing light source is incident, and a little optical fiber bundle portion including a plurality of little optical fiber bundles respectively having an outgoing plane; and a projection exposure system for projecting a light beam passing through the illumination optical system and transmitting a mask or a reticle onto an object to be exposed as a pattern image of the mask or the reticle.

It is also an object of the present invention to provide a projection exposure apparatus which is characterized by comprising a light source for emitting a light beam for exposure; an illumination optical system for irradiating a mask or a reticle with a light beam emitted from the exposing light source including optical fiber means comprising an optical fiber bundle portion including a plurality of optical fibers and having an entrance plane from which the light beam emitted from the exposing light source enters and a little optical fiber bundle portion including a plurality of little optical fiber bundles each having an outgoing plane, and a converging and diverging optical system for converging particular angle components of an incident light beam exiting from the optical fiber means and diverging the converged components; and a projection optical system for projecting a light beam passing through the illumination optical system and transmitting a mask or a reticle onto an object to be exposed as a pattern image of the mask or the reticle.

To achieve the above object, the present invention provides a projection exposure apparatus which is characterized by comprising a light source for emitting a light beam for exposure; an illumination optical system for irradiating a mask or a reticle with a light beam emitted from the exposing light source including optical fiber means comprising an optical fiber bundle portion including a plurality of optical fibers and having an entrance plane from which a light beam emitted from the exposing light source enters and a little optical fiber bundle portion including a plurality of little optical fiber bundles each having an outgoing plane; and a projection optical system for projecting a light beam passing through the illumination optical system and transmitting a mask or a reticle onto an object to be exposed as a pattern image of the mask or the reticle. More specifically, the projection exposure apparatus of the present invention is so constructed that a light beam emitted from the light source is converged to enter into an entrance plane on one side of the optical fiber bundle portion comprising a plurality of bundled optical fibers, and this optical fiber bundle portion is branched into a little optical fiber bundle portion comprising a plurality of little bundles of optical fibers. Further, when an object to be exposed such as a mask or a reticle is irradiated with light beams exiting from the plurality of little optical fiber bundles, the plurality of little optical fiber bundles are constructed such that relative positions of outgoing planes thereof are controllable.

By disposing a cylindrical mirror which has a symmetrical axis parallel to the normal of the entrance end plane of the optical fiber bundle portion and a mirror surface having a high reflectivity with respect to a light beam for exposure in the vicinity of the entrance plane such that the symmetry axis substantially coincides with the center of the outer shape of the entrance end plane, a light beam emitted from the light source can be led, in a ring shape, into the entrance end plane of the optical fiber bundle. Alternatively, by disposing, in the vicinity of the entrance end plane, a transparent member having a rotatory symmetry axis parallel to the normal of this entrance end plane and a concave cross-section, cut by a plane including this normal, which is substantially defined by straight lines, a light beam emitted from the light source can also be made to enter, in a ring shape, into the entrance end plane of the optical fiber bundle. This ring-shaped illuminating light can be obtained from the outgoing planes of the little optical fiber bundles by preventing light beams from entering into a central portion of the entrance plane of the optical fiber bundle. Further, these cylindrical mirror and the transparent member having a concave cross-section defined by straight lines can be automatically inserted into the vicinity of the entrance end plane of the optical fiber bundle and removed therefrom.

In the above structure, for a light source such as an excimer laser which emits a light beam with a high coherency and directivity, the lengths of the respective optical fibers constituting the optical fiber bundle are made different in accordance with the coherency between respective positions of the cross-section of a laser beam, to vary the optical paths, reduce the coherency of an irradiating light beam obtained from the outgoing end, and provide a uniform illuminating light beam. Also, when a laser beam with a high directivity is to enter into the entrance end plane of the optical fiber bundle, this entrance end plane is divided into a plurality of segments such that each segment has a different incident angle with respect to an entering laser beam, thereby making it possible to provide an irradiating light beam exiting from the outgoing end of the optical fiber bundle with a desired directivity required to particular illumination.

More specifically, the present invention is characterized by converging a light beam emitted from a light source to enter into one end plane of an optical fiber bundle formed by a plurality of bundled optical fibers, controlling relative positions of end planes of a plurality of little optical fiber bundles which are formed on the opposite side of the optical fiber bundle, and irradiating an object to be illuminated with light beams exiting from the plurality of little optical fiber bundles. The present invention is also characterized in that the number of the plurality of little optical fiber bundles is selected to be five or more, their end planes are positioned in a desired plane, and movement of the end planes caused by the control of the relative positions is made along the desired plane. The present invention is also characterized by simultaneously controlling the relative positions of the plurality of little optical fiber bundles by a single driving system. The present invention is also characterized in that the relative positions of the respective end planes of the little optical fiber bundles are similarly changed by the control of the relative positions of the plurality of little optical fiber bundles. The present invention is also characterized in that the relative positions of the end planes of the little optical fiber bundles are radially changed around a point on a plane formed by the end planes of the plurality of little optical fiber bundles by the control of the relative positions of the plurality of little optical fiber bundles. The present invention is also characterized in that the entrance end plane of the optical fiber bundle, which is one end plane thereof, has a circular or polygonal outer shape, and a cylindrical mirror which has a symmetry axis parallel to the normal of this entrance end plane and a mirror surface having a high reflectivity with respect to a light beam for exposure is disposed in the vicinity of the entrance end plane such that the symmetry axis thereof substantially coincides with the center of the outer shape of the entrance end plane of the optical fiber bundle, whereby a light beam emitted from the light source is formed in a ring shape and enters into the entrance end plane of the optical fiber bundle with a high light utilizing efficiency. The present invention is also characterized in that the cylindrical mirror can be automatically inserted in the vicinity of the entrance end plane of the optical fiber bundle and removed therefrom. The present invention is also characterized in that the entrance end plane, which is one end plane of the optical fiber bundle, has a circular or polygonal outer shape, and a transparent member, having a rotatory symmetry axis parallel to the normal of this entrance end plane and a concave cross-section, cut by a plane including this normal, which is substantially defined by straight lines, is disposed in the vicinity of the entrance end plane, whereby a light beam emitted from the light source is formed in a ring shape and enters into the entrance end plane of the optical fiber bundle with a high light utilizing efficiency. The present invention is also characterized in that the transparent member can be automatically inserted in the vicinity of the entrance and plane of the optical fiber bundle and removed thereform. The present invention is also characterized in that on the entrance end plane which is one end plane of the optical fiber bundle, a space between light transmitting portions of the respective optical fibers is filled with a high reflective material to reduce heat generation caused by the absorption of light incident to the entrance end plane. The present invention is also characterized in that the entrance end plane, which is one end plane of the optical fiber bundle, has the shape of light transmitting portions of the respective optical fibers made different from the shape of light emitting portions on the outgoing end plane of the respective optical fibers. The present invention is also characterized in that a laser light source is employed as a light source, and a light beam emitted from the laser light source, after providing the light beam with a desired beam diameter, is led into one end plane of the optical fiber bundle formed by a plurality of bundles optical fibers. The present invention is also characterized in that the lengths of the respective optical fibers constituting the optical fiber bundle are made different in accordance with the coherency of a laser beam emitted from the laser light source on the entrance end plane of the optical fiber bundle, so as to reduce the coherency of an illuminating light beam obtained from the outgoing end to achieve the uniformity of illumination. The present invention is also characterized in that after the optical paths have been changed in respective parts within the beam cross-section in accordance with the coherency between respective positions on the beam cross-section of a laser beam emitted from the laser light source, light beams from the respective parts are led into the optical fiber bundle. The present invention also provides an illumination method, wherein after a laser beam emitted from the laser light source is provided with a desired beam diameter, one end plane of an optical fiber bundle formed by a plurality of bundled optical fibers is inserted in the optical path, and a laser beam exiting from the opposite end plane of the optical fiber bundle is employed for illumination, which is characterized in that the entrance end plane of the optical fiber bundle comprises a plurality of portions, and the respective portions are constructed such that the angle formed by the normal of the entrance end plane with the entrance direction of the laser beam, i.e., the incident angle varies in the respective portions, whereby the exiting light beam from the outgoing end plane is provided with a desired light directivity for illumination.

Further, to achieve the above objects, the present invention establishes, in the projection exposure apparatus, optically conjugated relationship between the outgoing end of the optical fiber means in the illumination optical system and the entrance plane of the converging and diverging optical system.

Further, to achieve the above objects, the present invention provides the projection exposure apparatus with optically modifying means for modifying a light beam incident to the optical fiber bundle in the illumination optical system by refraction or reflection.

Further, to achieve the above objects, the present invention provides the projection exposure apparatus with optically modifying means for modifying a light beam incident to the converging and diverging optical system in the illumination optical system by refraction or reflection.

Further, to achieve the above objects, the optical fiber in the projection exposure apparatus has such a numerical aperture (NA) that an illuminating light beam having an inclination modified by the optically modifying means can sufficiently transmit the converging and diverging optical system.

Further, to achieve the above objects, the converging and diverging optical system in the projection exposure apparatus has such a numerical aperture (NA) that an illuminating light beam having an inclination modified by the optically modifying means can sufficiently transmit the converging and diverging optical system.

Further, to achieve the above objects, the present invention provides the projection exposure apparatus with optical means for establishing the relationship of Keller illumination or optical infinity between the outgoing plane of the optical fiber in the illumination optical system and the entrance plane of the converging and diversing optical system.

Further, to achieve the above objects, the present invention provides a projection exposure method comprising the steps of: leading a light beam emitted from an exposing light source into an entrance plane of optical fiber means including an optical fiber bundle portion formed by a plurality of bundled optical fibers having the entrance plane, and a little optical fiber bundle portion formed by a plurality of little optical fiber bundles branched from the optical fiber bundle portion and each having an outgoing plane; converging particular angle components of light beams exiting from the outgoing planes of the optical fiber means and diverging the converged components by a converging and diverging optical system, and irradiating a mask or a reticle with the light beam through the converging and diverging optical system; and projecting the light beam transmitting the mask or the reticle onto an object to be exposed as a pattern image of the mask or the reticle.

Further, to achieve the above object, the present invention provides an illumination optical apparatus comprising: a light source; optical fiber means including an optical fiber bundle portion formed by a plurality of bundles optical fibers having an entrance plane to which a light beam emitted from the light source is incident, and a little optical fiber bundle portion formed by a plurality of little optical fiber bundles which are branched from the optical fiber bundle portion and each have an outgoing plane; and a converging and diverging optical system for converging particular angle components of a light beam exiting or emitting from the optical fiber means and entering thereinto and diverging the converged components.

The above-mentioned means can readily provides illumination with a relatively high directivity, i.e., a small $\sigma$ value suitable for a phase shift reticle, ring-shaped illumination for forming a high resolution pattern by a normal reticle, or illumination with a conventional directivity. The above-mentioned means, when employed, allows a light beam emitted from the light source to irradiate an object to be exposed with a high light utilizing efficiency.

When an excimer laser or the like is to be employed in future for reducing exposure wavelength to attend to patterns drawn with thinner line widths, the above-mentioned methods readily solve problems of ununiform illumination due to the coherency and directivity of the laser, thereby making it possible to readily realize a variety of illumination with little waste of light also in an excimer laser stepper.

Thus, the present invention can be implemented in an illumination system for use in exposure, test, display and so on of patterns to readily provide optimal illumination in the relationship between the shape and size of a particular pattern to be exposed, tested or displayed and optical systems used for such exposure, testing and display purposes in a relatively simple structure as well as to easily modify the optimal illumination in accordance with changes in the optical systems. In this manner, illuminating light of a conventional fixed illumination system need not be partially shielded, and a desired illumination directivity and illuminating light distribution can be realized without decreasing the light utilizing efficiency, thereby providing an exposure apparatus or a testing apparatus presenting a improved throughput. Also, in a display unit, a clear display can be accomplished or a light source with a smaller power is sufficient for the same brightness as before.

The above-mentioned means can readily provides illumination with relatively high directivity, i.e., a small $\sigma$ value suitable for a phase shift reticle, ring-shaped illumination for forming a high resolution pattern by a normal reticle, or illumination with a conventional directivity. Further, the above-mentioned means, when employed, allows a light beam emitted from the light source to irradiate an object to be exposed with a high light utilizing efficiency.

BRIEF DESCRIPTION OF THE DRAWINGS

FIGS. 35A and 35B illustrate an illumination modifying means employing a lens based on the second embodiment of the present invention.

DESCRIPTION OF THE PREFERRED EMBODIMENTS

The present invention will hereinafter be described in detail based on the accompanying drawings.

To begin with, a first embodiment of the present invention will be explained with reference to FIGS. 1-25.

Figure 4A:
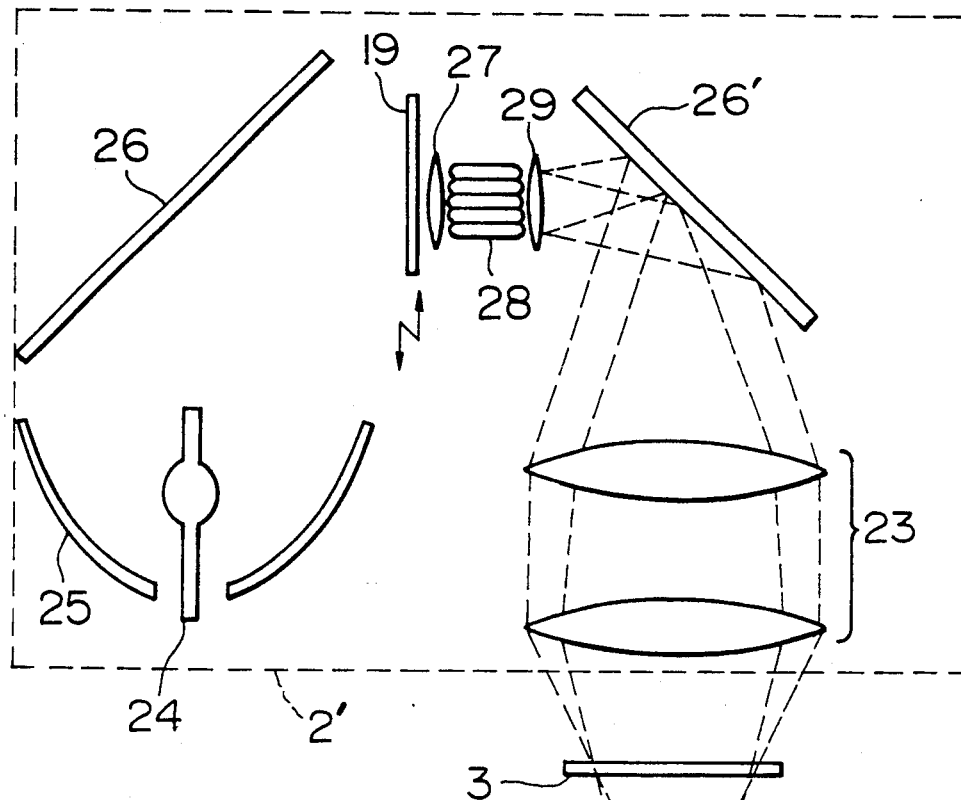
FIGS. 4A and 4B show how a variety of illumination methods are realized by a projection exposure apparatus employing an illumination optical system according to the present invention.

FIG. 4A illustrates an exposure illumination optical system in a projection exposure apparatus. An i-line beam emitted from a mercury lamp 24 is reflected by an elliptical mirror 25 and converged into a rod lens 28 through a chromatic mirror 26 for selecting wave band and an input lens 27. The light beam through the rod lens 28 is converged by an output lens 29, reflected by a mirror 26', and irradiated to a reticle 3 after passing through a condenser lens 23. The light beam passing through a pattern drawn on the reticle 3 forms, by a reduction lens 4, a 1/5 reduced image of the pattern on the reticle on a wafer 5 fixed on a wafer chuck carried on a wafer stage 6, and thus the wafer 5 is exposed thereby. In a single exposure, a square area with the side ranging from 20 mm to 25 mm is exposed to simultaneously produce two or three chips. The wafer stage is precisely aligned by a laser beam 60 from a laser scale (not shown) and a flat mirror 61 such that the whole surface of the wafer is exposed to the pattern of the chip.

Figure 4B:
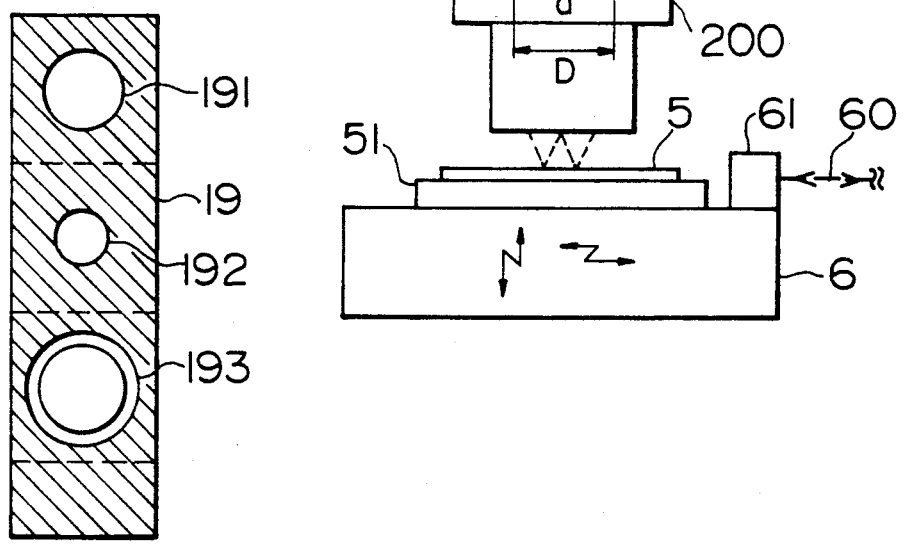

When the foregoing phase shift reticle is used in the projection exposure apparatus, by way of example, the directivity must be high, i.e., the $\sigma$ value must be small, so that a light shielding plate for shielding an outer peripheral portion of the light beam for exposure need be inserted at a location conjugated with the entrance pupil of the imaging lens for exposure in the exposure illumination system. Thus, a light shielding plate 19 having an opening as shown in FIG. 4B is disposed in front of the input lens 27 or behind the output lens 29 so as to employ an i-line portion passing through the relatively small opening 192.

Also, the above ring-shaped illumination requires a disk to be inserted at a location conjugated with this entrance pupil for shielding a central portion of the light beam for exposure. In this case, a light shielding plate 19 having a ring-shaped opening 193 as shown in FIG. 4B is employed. It is further preferable in this ring-shaped illumination that the light beam for exposure at the location conjugated with the entrance pupil of the illuminating beam be enlarged by a factor of 1.2-1.6 as compared with a light beam for exposure used in the conventional semiconductor exposure apparatus.

If the variety of methods for improving the resolution are to be realized by a single semiconductor exposure apparatus, the light shielding plate must be replaced with a different one every time a different method is employed, and additionally, part of the light beam for exposure is shielded, i.e., the exposing light is wasted, which results in requiring a longer time for exposing a wafer to an integrated circuit chip pattern and largely deteriorating the throughput of exposure. For example, if the $\sigma$ value is changed from 0.6 to 0.4 in order to employ a phase shift reticle, an exposing time period longer by 2.25 times is required since exposing energy is reciprocally proportional to a square of the ratio $\sigma$.

The present invention has been made to solve the above problems, and will be described in greater detail with reference to the accompanying drawings.

Figure 1:
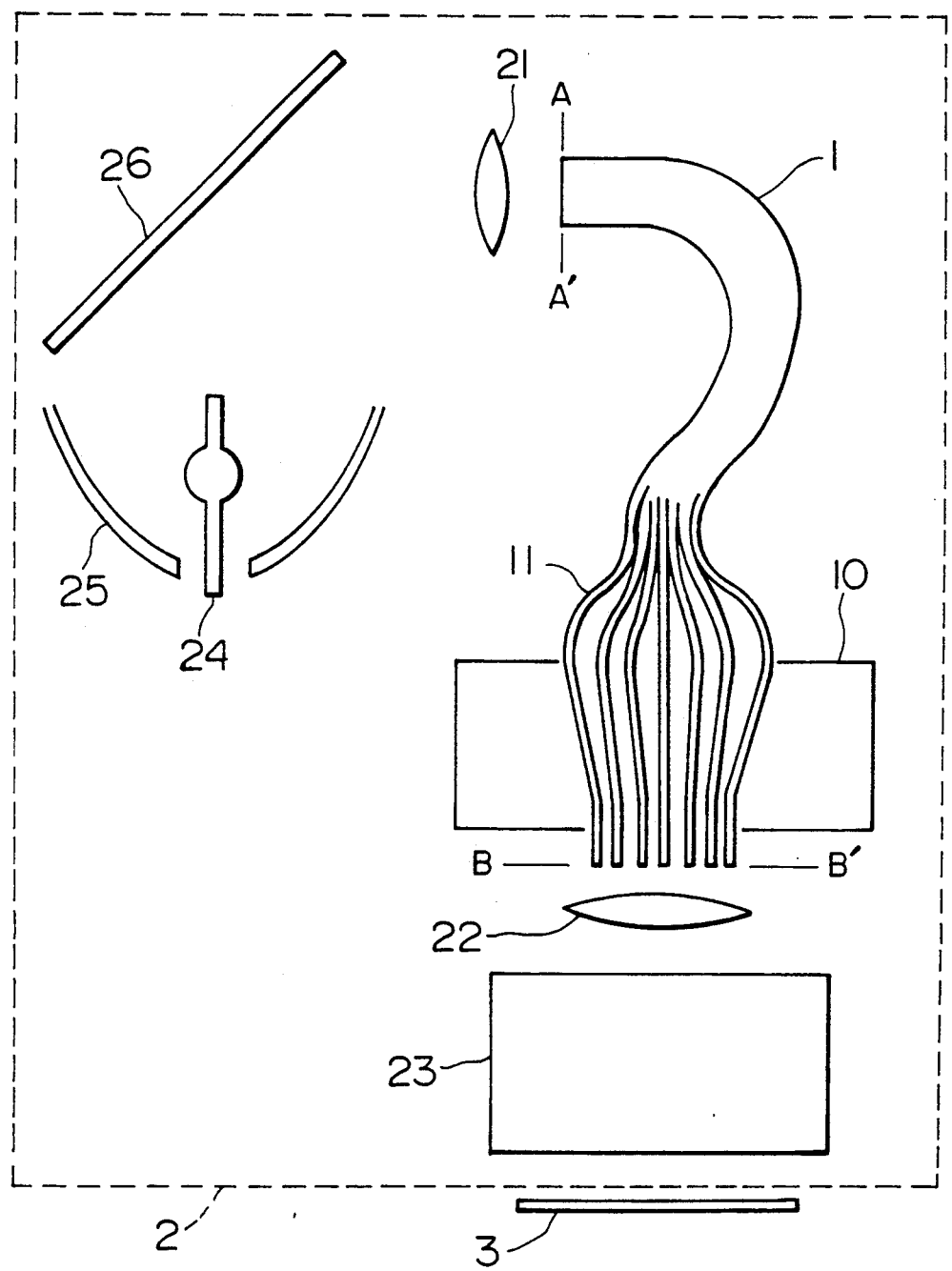
FIG. 1 is a diagram illustrating an exemplary optical system of an exposure illumination apparatus employing a mercury lamp as a light source for use in a projection exposure apparatus according to a first embodiment of the present invention.

FIG. 1 illustrates an embodiment of an exposure illumination apparatus 2 according to the present invention. A light beam emitted from a mercury lamp 24 is reflected by an elliptical mirror 25, further reflected by a chromatic mirror 26 for selecting wave band for selectively reflecting a desired exposing light wave band, for example, i-line, and then transmits a lens 21 to enter into a A—A' plane of an end surface of a bundle of optical fibers 1. The entrance end plane A—A' includes a large number of bundled optical fibers, where the diameter of each optical fiber is selected to be 0.2 mm and the bundle has a diameter of approximately 30 mm. The bundled optical fibers are branched into a plurality of little bundles 11 of optical fibers at a location a predetermined distance away from the entrance plane thereof. By a mechanism 10 for changing relative positions of the little bundles of optical fibers having a function of controlling the relative positions of the respective end planes of the branched little bundles 11 of optical fibers, outgoing end planes of the little optical fiber bundles 11 can be changed their relative positions in a plane B—B'. Since the outgoing ends of the little optical fiber bundles located on the B—B' plane serve as a so-called secondary light source, the shape and size of the secondary light source can be changed by operating the mechanism 10 for changing relative positions of the little optical fiber bundles. Exposing light exiting or emitting from the respective end planes of the small optical fiber bundles on the B—B' plane passes through an output lens 22 and then a condenser lens 23 to illuminate an object to be exposed, i.e., a reticle 3 in the same manner as the illumination system employed in the normal semiconductor exposure apparatus or the like.

In the semiconductor exposure apparatus, a secondary light source of the mercury lamp in the conventional exposing light illumination system 2' is the outgoing end of the so-called rod lens, and this outgoing end corresponds to the outgoing ends of the little optical fiber bundles 11 on the B—B' plane of FIG. 1. The light beam for exposure emitted from this secondary light source irradiates the reticle 3 through the output lens 22 and the condenser lens 23. The light beam transmitting a pattern drawn on the reticle 3 forms, by a reduction projection exposing lens 4, a 1/5 reduced image of the pattern on the reticle 3 on the surface of a wafer 5 fixed on a wafer chuck 51 carried on a wafer stage 6 which is roughly and finely movable in the three dimensional directions x, y, z, and the wafer 5 is thus exposed. As explained above, in the conventional semiconductor exposure apparatus, the ratio of the diameter d of an image 200 on a pupil 41 of a reduction exposure lens of a secondary light source in a exposure illumination system to the diameter D of the pupil, i.e., the partial coherency $\sigma$ was fixed. However, by providing such a semiconductor exposure apparatus with the exposure illumination system 2 of the present invention, the size of an image formed by the secondary light source on the pupil 41 of the reduction exposure lens is made variable by operating the mechanism 10 for changing relative positions of the little optical fiber bundles. For example, the mechanism 10 for changing the relative positions of the little optical fiber bundles is driven by a control system 7 including a driving control circuit so as to set the value $\sigma$ to approximately 0.6 for a conventional reticle which represents pattern information by passing light therethrough or shielding the same, or to at least approximately 0.4 for employing a phase shift reticle.

Figure 2:
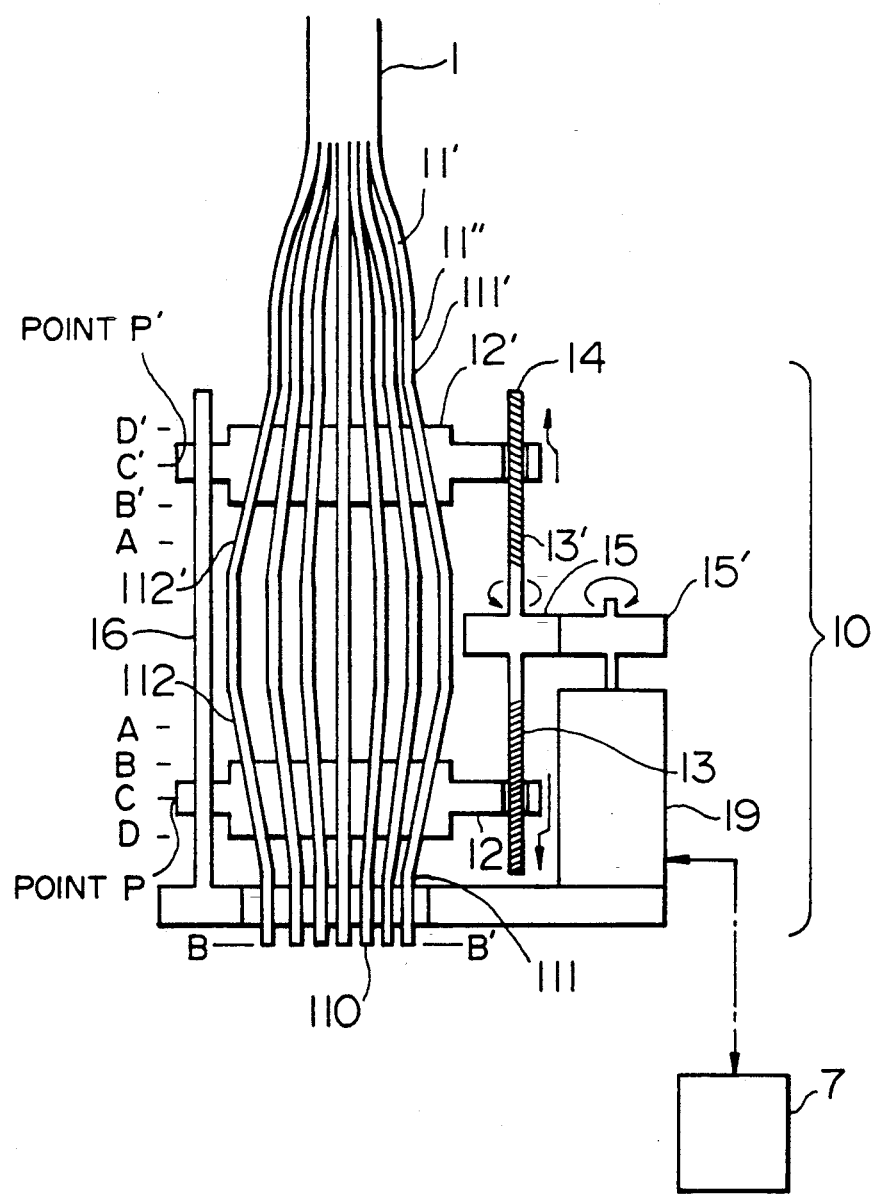
FIG. 2 is illustrates a mechanism for changing relative positions of little optical fiber bundles of an illumination apparatus according to the present invention.
Figure 3A:
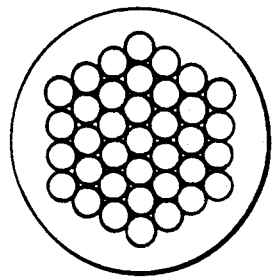
FIGS. 3A–3D illustrate positions of little optical fiber bundles in the mechanism for changing relative positions of little optical fiber bundles.
Figure 3B:
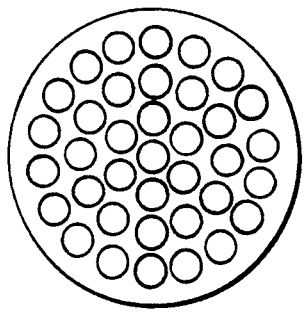
Figure 3C:
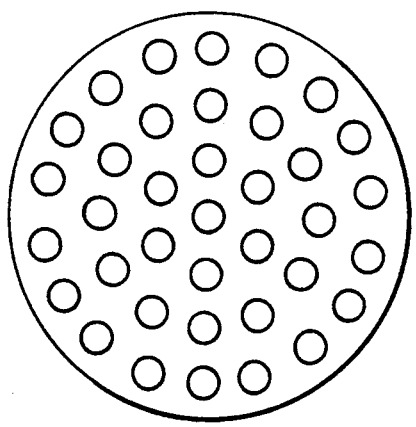
Figure 3D:
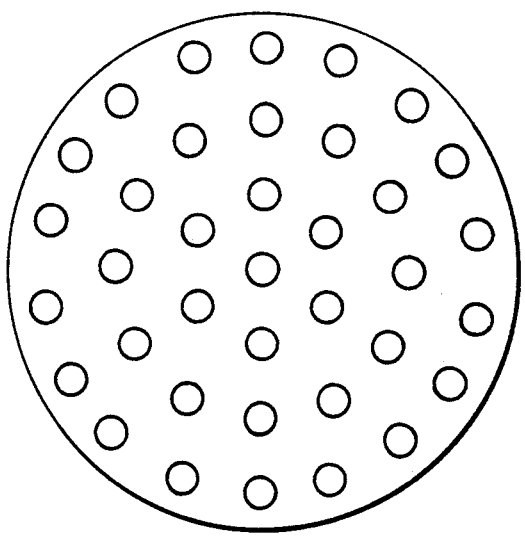

FIG. 2 illustrates in detail the mechanism 10 for changing relative positions of the little optical fiber bundles according to the first embodiment of the invention. The optical fiber bundle 1 consists of branched flexible portion 11' and a portion 11" subsequent thereto which is surrounded by a rigid metal pipe. An end surface of this portion 11" surrounded by the rigid metal pipe serves as the outgoing end which appears on the plane B—B'. The portion 11" surrounded by the metal pipe is substantially symmetric about an intermediate point in the longitudinal direction thereof, and comprises perpendicular portions (in the light advancing direction) 111, 111' and oblique portions 112, 112'. The oblique portions 112, 112' have smooth surfaces so as to be slidable respectively along the directions of oblique guiding holes formed in oblique guiding hole slide mechanisms 12, 12'. The oblique guiding hole slide mechanisms 12, 12' have a plurality of slide holes in the respective peripheral portions, through which a plurality of guiding rods extend. The mechanisms 12, 12' are driven to approach to each other or separate from each other by rotating, in the right or left direction, a rotating shaft 14 having a bolt rotatable in the left and right directions which is driven by a motor 19 through gears 15, 15'. As a result, when the mechanisms 12, 12' approach, the respective optical fiber ends 110 also approach, whereby the partial coherency $\sigma$ of the illumination becomes smaller. Conversely, as the mechanisms 12, 12' separate, the partial coherency $\sigma$ becomes larger. FIGS. 3A-3D show how the partial coherency $\sigma$ varies due to changes in the distance between the slide mechanisms 12 and 12'. Specifically, FIG. 3A illustrates the alignment of the little optical fiber bundles 11 on the outgoing end plane B—B' when the oblique guiding hole slide mechanisms 12, 12' are closest to each other. FIGS. 3B-3D illustrate the alignments when the oblique guiding hole slide mechanisms 12, 12' are gradually separated from each other. By thus driving the motor 19 based on an instruction signal from the control system 7, a desired illumination directivity s can be readily set in a short time without wasting light generated from a light source.

Figure 6:
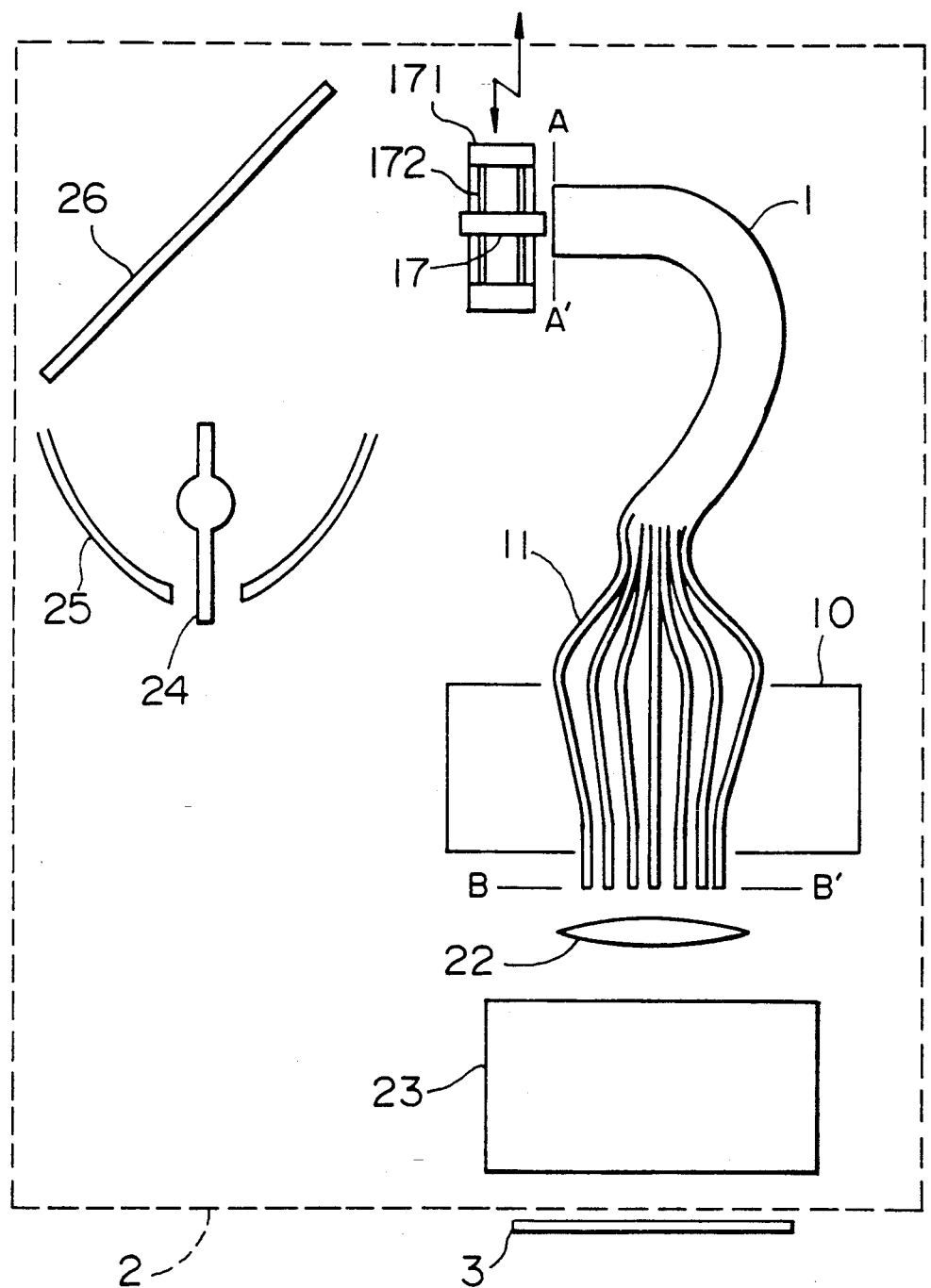
FIG. 6 is illustrates a first example for realizing an illuminating beam in a ring in an illumination apparatus for use in a projection exposure apparatus or the like based on the first embodiment of the present invention.
Figure 7A:
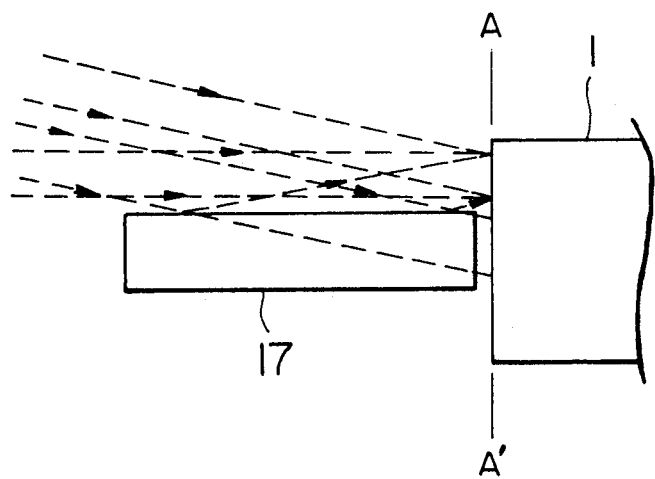
FIGS. 7A and 7B illustrate the example of FIG. 6 in greater detail.
Figure 7B:
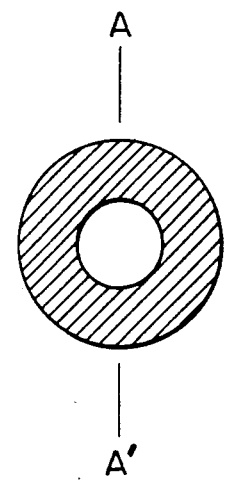

Next, an example of the present invention for realizing ring-shaped illumination will be described with reference to FIG. 6. When reference numerals designating constituents in FIG. 6 are the same as those in FIG. 1, they represent the same constituents. A light beam emitted from a mercury lamp 24 is converged into the entrance end plane of an optical fiber bundle 1. This entrance end plane has a circular or substantially polygonal external shape. A cylindrical mirror which has a symmetry axis parallel to the normal of this entrance end plane and a mirror surface having a high reflectivity with respect to a light beam for exposure is disposed such that the symmetry axis thereof substantially coincides with the center of the external shape of the entrance end plane of the optical fiber bundle 1, whereby a light beam emitted from the light source is in a ring shape and enters into the entrance end plane of the optical fiber bundle with a high light utilizing efficiency. In this structure, a light beam, which would be incident to a central portion of the optical fiber bundle if this cylindrical mirror 17 was not used, is reflected by the surface of the cylindrical mirror 17 as shown in FIG. 7A, and enters into a portion inside the perimeter of the optical fiber bundle 1 and in the vicinity of the perimeter, as indicated by hatchings in FIG. 7B. Since the incident angle of this light beam is substantially equal to that of a light beam which would enter the entrance end of the optical fiber bundle when the cylindrical mirror was not used, the light beam enters into the optical fiber bundle without wasting the light beam, and a ring-shaped exposure illuminating beam is exiting from little optical fiber bundles 11 on the other end of the optical fiber bundle 1. It goes without saying, in this case, that the positional relationship between the optical fibers on the entrance end plane and the same optical fibers on the outgoing end plane is not arbitrary, but fibers in a peripheral portion on the entrance end are likewise positioned in a peripheral portion on the outgoing end plane.

Figure 8:
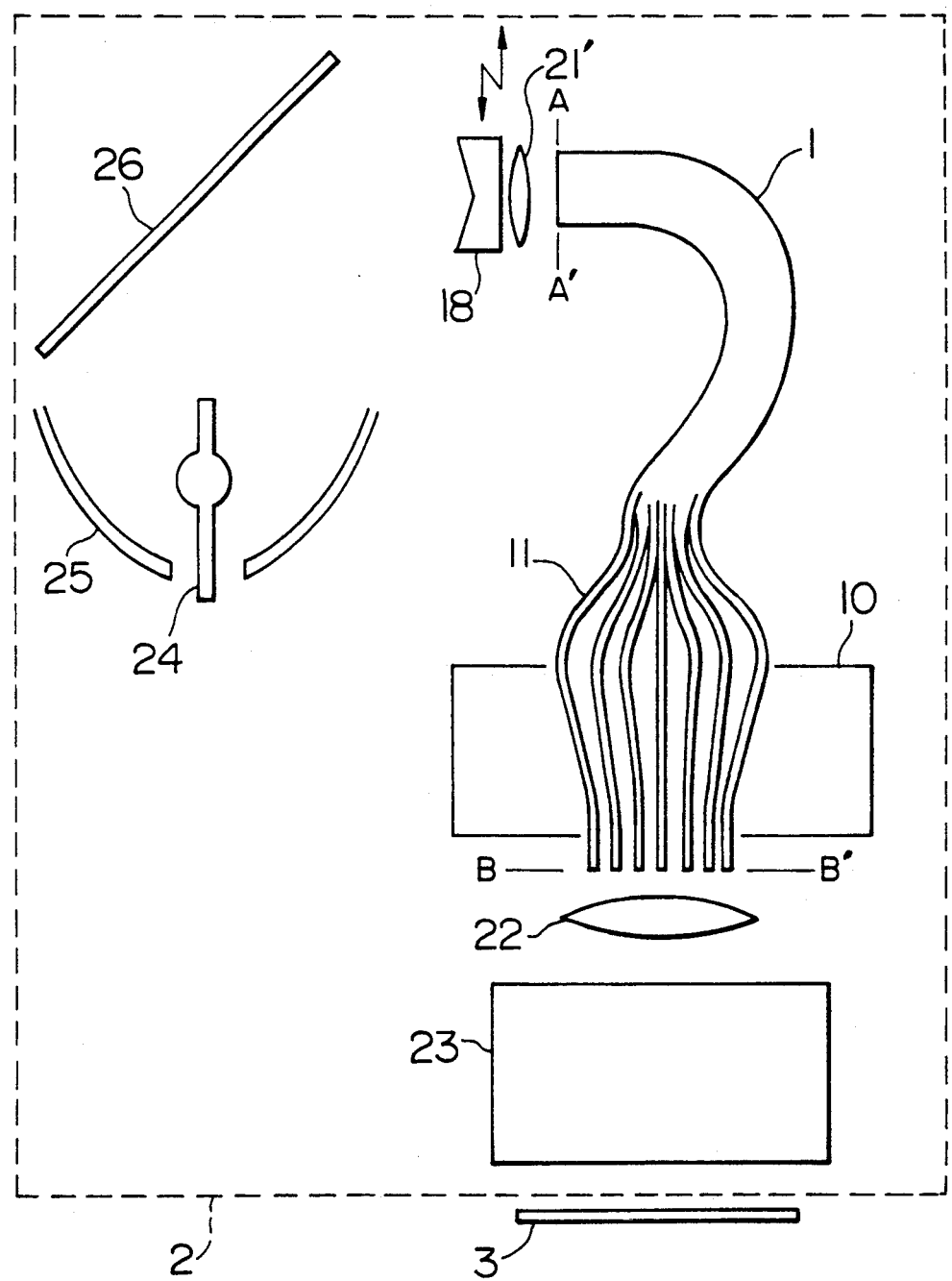
FIG. 8 illustrates a second example for realizing an illuminating beam in a ring in an illumination apparatus for use in a projection exposure apparatus based on the first embodiment of the present invention.
Figure 9A:
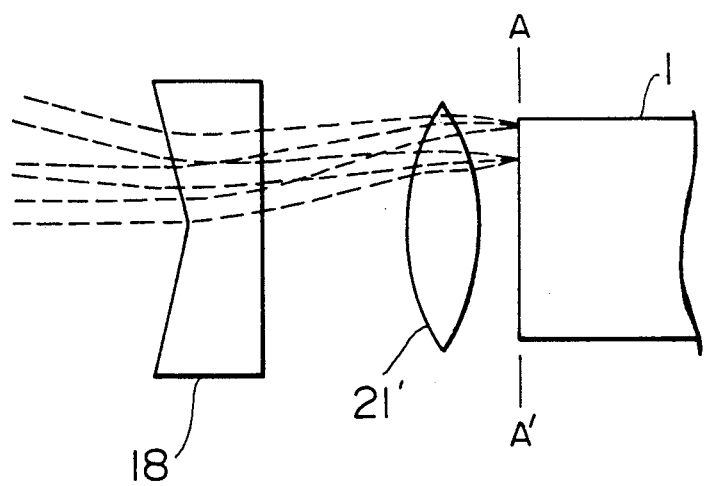
FIGS. 9A and 9B illustrate the example of FIG. 8 in greater detail.
Figure 9B:
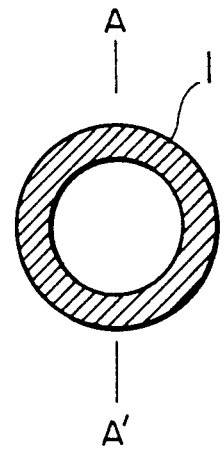

Another example of the invention for realizing ring-shaped illumination will be described with reference to FIG. 8. When reference numerals designating constituents in FIG. 8 are the same as those in FIG. 1, they represent the same constituents. A light beam emitted from a mercury lamp 24 is converged into the entrance end plane of an optical fiber bundle 1. This entrance end plane has a circular or substantially polygonal external shape. Disposed in front of the entrance end plane is a transparent member, a rotatory symmetry axis of which is parallel to the normal of this entrance end plane, and a concave cross-section of which, cut by a plane including this normal, is substantially defined by straight lines. Since light beams transmitting this concave transparent member diverge outside the optical axis, if a convex lens is used to make parallel chief rays of light beams incident to the respective optical fibers, the light beam emitted from the light source can enter into the entrance end plane of the optical fiber bundle in a ring shape with a high light utilizing efficiency. In this manner, light beams will not reach a central portion of the entrance end plane of the optical fiber bundle but will enter only into a portion inside the perimeter of the optical fiber bundle and near the perimeter as shown in FIG. 9A, and consequently a ring-shaped exposure illumination light beam exits from the little optical fiber bundles 11 on the other end as indicated by hatchings in FIG. 9B. It goes without saying, also in this case, that the positional relationship between the optical fibers on the entrance end plane and the same optical fibers on the outgoing end plane is not arbitrary, but fibers in a peripheral portion on the entrance end are likewise positioned in a peripheral portion on the outgoing end.

Figure 10A:
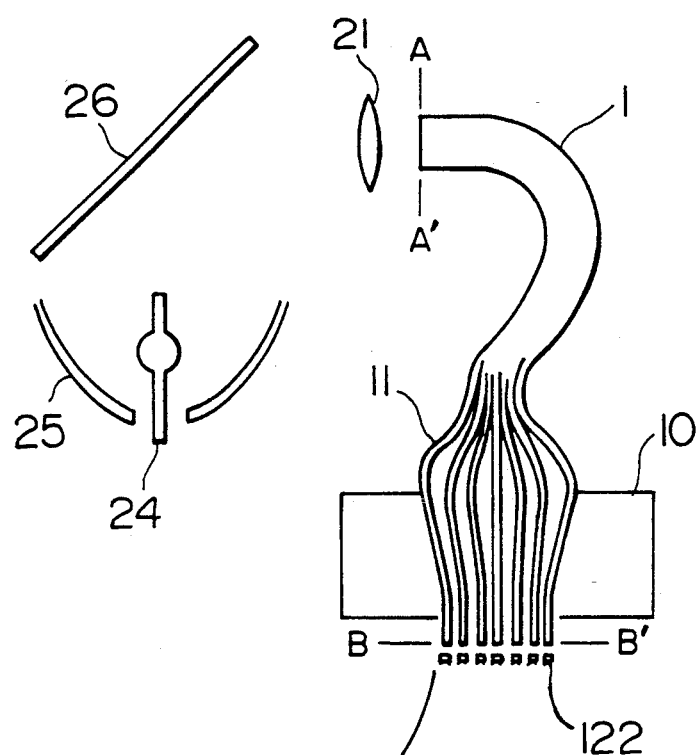
FIGS. 10A and 10B illustrate an embodiment of an illumination apparatus for use in a projection exposure apparatus or the like based on the first embodiment of the present invention which has optical diverging optical parts on outgoing ends of little optical fiber bundles.
Figure 10B:
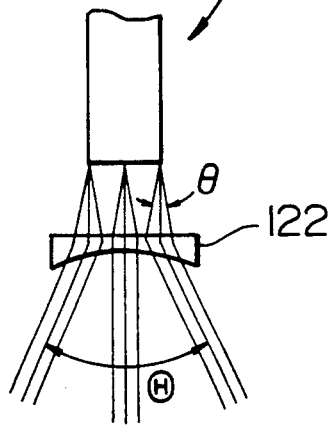

FIGS. 10A and 10B illustrate an example of means for providing a light beam exiting from the optical fiber bundle 1 with a desired angle of divergence. As shown in FIG. 10A, each of the little optical fiber bundles 11 on the outgoing end is provided with a minute concave lens 122 disposed in front thereof so as to widen a radiation angle (angle of divergence) $\theta$ of each little optical fiber bundle 11 to an angle $\theta$. Although this example employs the concave lenses disposed in front of the outgoing ends of the little optical fiber bundles, it will be apparent that the object of the present invention may also be achieved by employing convex lenses.

Figure 11A:
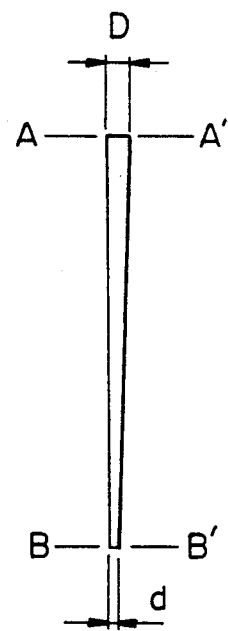
FIGS. 11A and 11B show, by way of example, how the diameter of an optical fiber is changed.
Figure 11B:
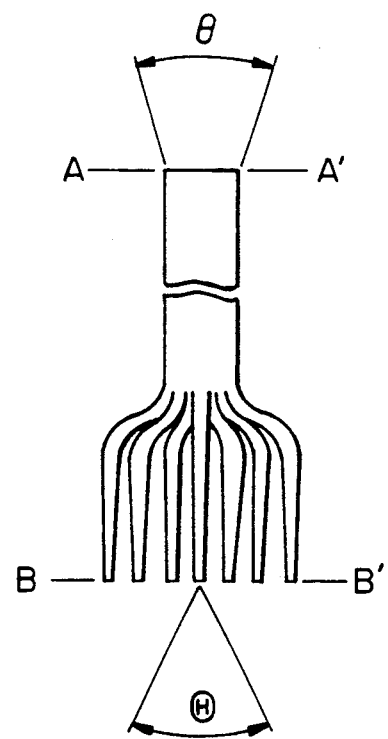

FIGS. 11A and 11B illustrate an example of means for providing a light beam exiting from the optical fiber bundle 1 with a desired angle of divergence. When the diameter of each optical fiber is gradually changed such that the diameter D on the entrance end plane of the optical fiber bundle is different from the diameter d on the outgoing end plane, a radiation angle $\theta$ on the entrance end side can be made different from a radiation angle $\theta$ on the outgoing end side. If the radiation angle $\theta$ on the outgoing end side is made to be a desired angle, a desired angle of divergence can be provided without employing concave lenses as the example shown in FIG. 10A.

Figure 12A:
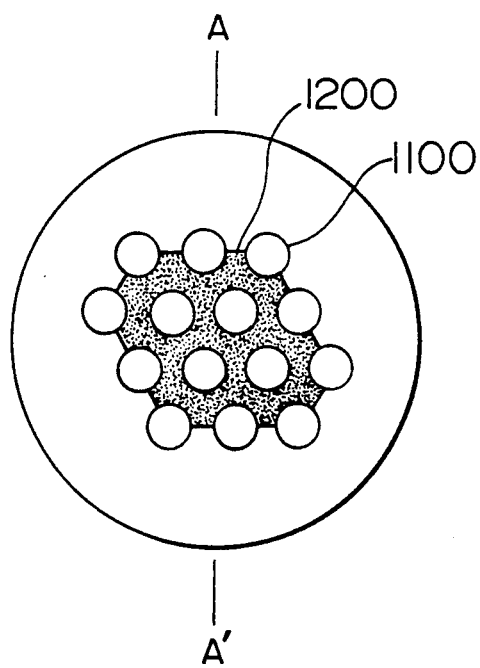
FIGS. 12A and 12B are plan views of optical fiber entrance ends where a high reflective material is used between adjacent optical fibers.
Figure 12B:
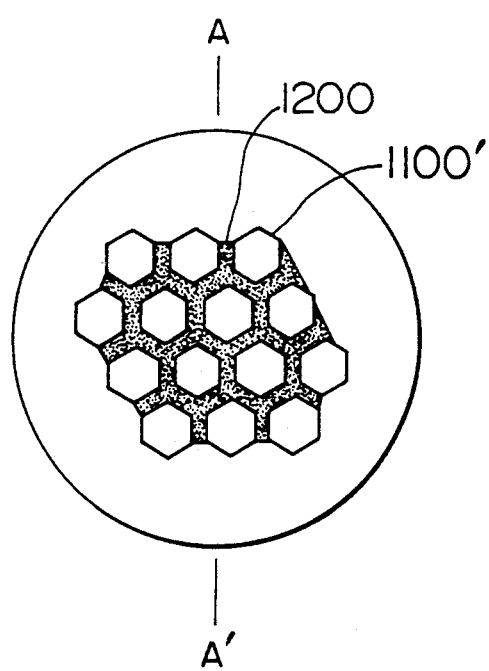

FIGS. 12A and 12B each illustrate an enlarged view of the structure of the entrance end plane of the optical fiber bundle 1. FIG. 12A shows that the optical fiber bundle 1 comprises optical fibers, the entrance end of which is circular, and a space between the respective optical fibers is filled with a material having a high reflectivity or is so structured as to provide a high reflectivity. Particularly, when an ultra-violet mercury lamp for generating an i-line or a KrF or ArF excimer laser for generating far ultra-violet rays are employed as a light source, a material exhibiting a high reflectivity in this wavelength band such as aluminum may be used for protecting the surface thereof, and a thin film of silicon oxide having a reflectivity enhancing effect may be coated thereon for protection. In this manner, even if energy of exposing light becomes high, such optical energy is absorbed on the entrance end plane of the optical fiber bundle to prevent the entrance end plane of each optical fiber from being damaged by the optical energy, thereby making it possible to realize an optical fiber bundle provided with a high illuminance and a long life. Incidentally, as can also be understood from FIGS. 12A and 12B, the light utilizing efficiency becomes higher as the area of the space between the respective optical fibers is smaller. Particularly, it is preferable to employ the shape of an entrance end plane of fibers as shown in FIG. 12B so as to eliminate the space between the fibers in principle. Apparently, it is sufficient for achieving the object of the present invention to provide the highly reflective material filling the space only in the vicinity of the entrance end plane of the optical fiber bundle. Also, the surface of this highly reflective material filling the space may be selected to be plane, concave or the like such that light reflected by this reflecting plane matches with a target of the illumination system of the present invention.

Figure 5A:
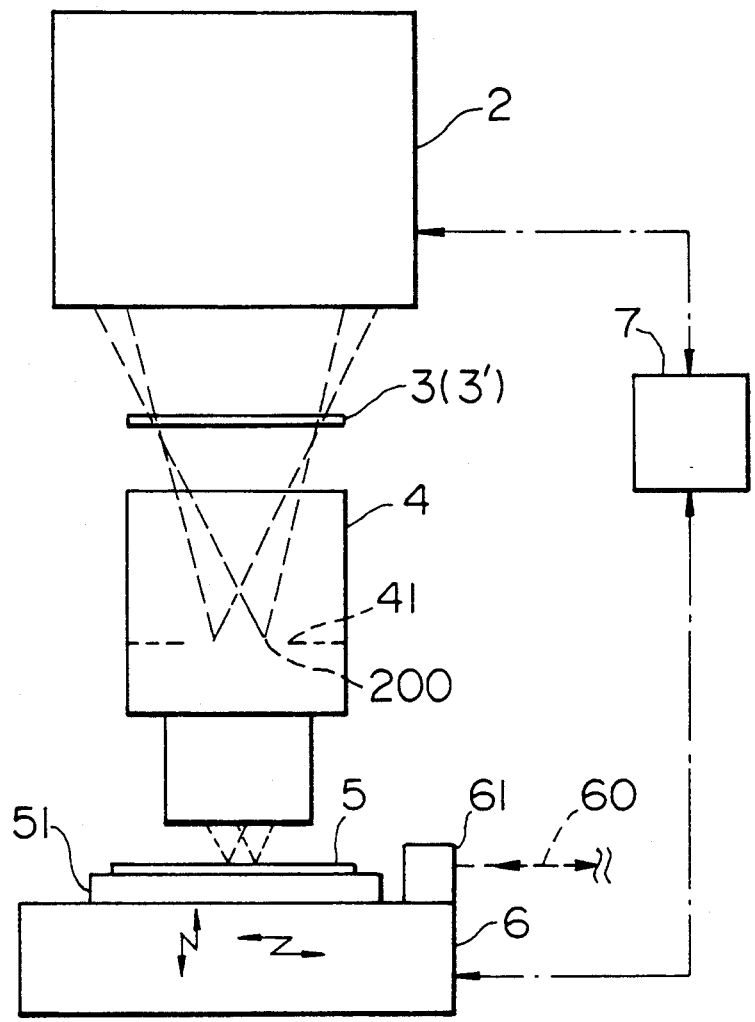
FIGS. 5A and 5B illustrate a projection exposure apparatus comprising the illumination optical system according to the present invention.
Figure 13A:
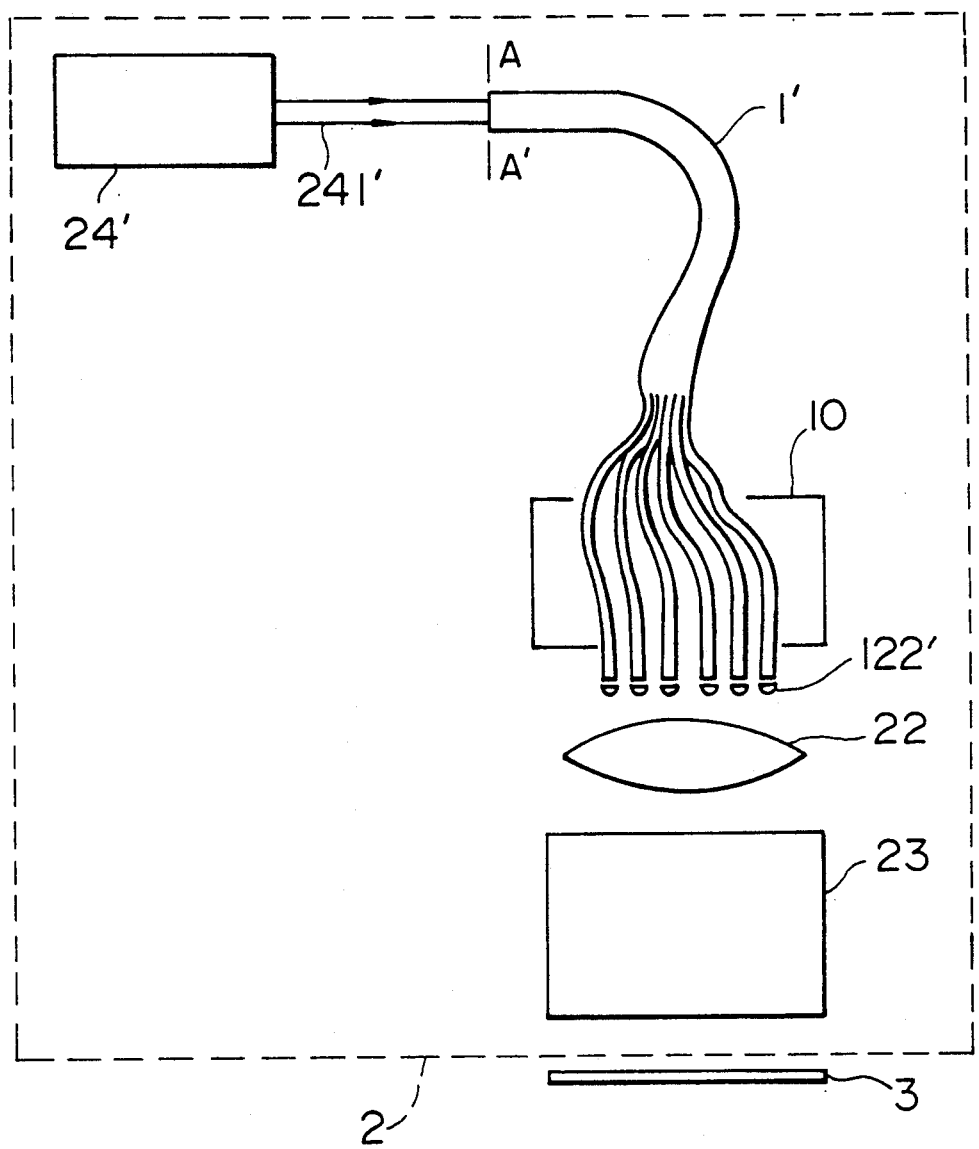
FIGS. 13A and 13B illustrate the first embodiment which employs a laser as a light source.
Figure 13B:
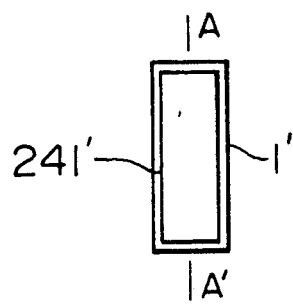

FIGS. 13A and 13B illustrate an embodiment of an illumination apparatus according to the present invention which employs a KrF or ArF excimer laser as a light source. Reference numerals in FIG. 13A identical to those in FIG. 5A represent the same constituents. A laser light beam emitted from a light source 24' has a rectangular beam cross-section and is led, without changing the shape, into an optical fiber bundle 1' having an identically rectangular entrance end plane. Each of little optical fiber bundles 11 on the outgoing end plane is provided with a small lens, similarly to the example shown in FIG. 10A, so as to provide emitted light with a desired angle of divergence. By providing the projection exposure apparatus of FIG. 5A with this illumination system, a projection exposure apparatus with a high laser light utilizing efficiency is realized. This illumination system employing a laser beam may be applied not only to the projection exposure apparatus but also to a variety of apparatus which require a laser beam to uniformly illuminate, thereby making it possible to realize illumination which has a high light utilizing efficiency and a variable light directivity or a variable illuminating range.

Figure 5B:
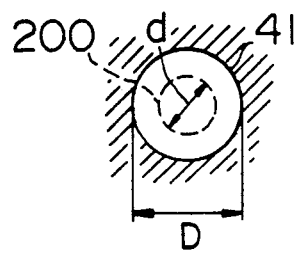
Figure 14A:
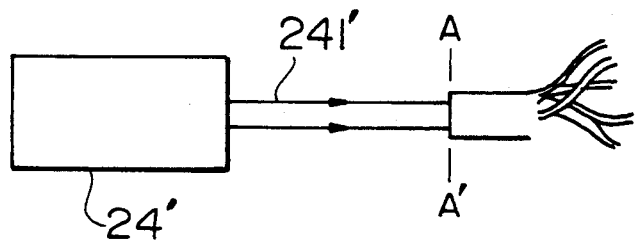
FIGS. 14A-14E illustrate the relationship between an entrance end and an outgoing end of optical fibers in the embodiment which employs a laser as a light source.
Figure 14B:
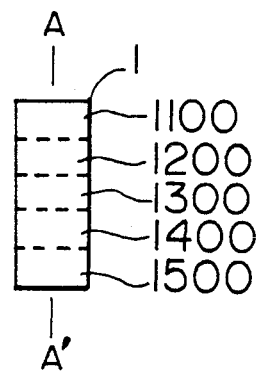
Figure 14C:
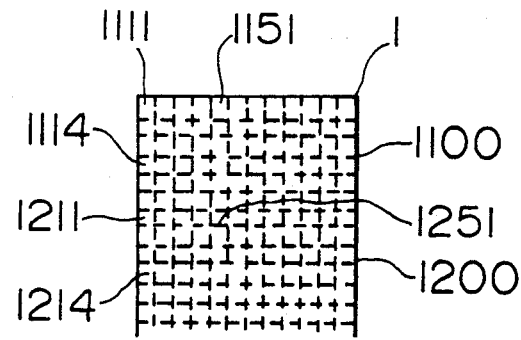
Figure 14D:
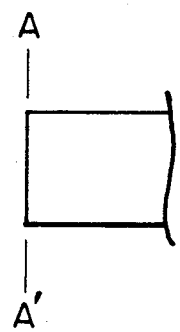
Figure 14E:
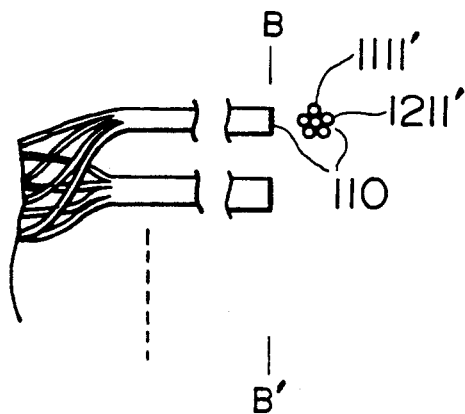

FIGS. 14A-14E illustrate an embodiment of a projection exposure apparatus according to the present invention. Reference numerals in FIGS. 14A-14E identical to those in FIGS. 5A and 5B represent the same constituents. A posing light source is implemented by a KrF or ArF excimer laser. Since a reduction projection lens for use in a reduction exposure apparatus is made solely of synthetic quartz, the spectrum width of laser light being, for example, approximately 1 pm, will avoid deterioration in resolution due to chromatic aberration caused by dispersed reflectivity of the quartz glass, thereby making it possible to expose a wafer to a finer pattern. However, as the spectrum width is narrower, the number of modes generally tends to be reduced. As a result, assuming that the lengths of the respective optical fibers contained in the optical fiber bundle of FIG. 13A are all substantially equal, if light beams exiting from the respective little optical fiber bundles 11 are diverged and overlap with each other, interferency will arise to cause nonuniformity in illuminating light on the reticle. In this embodiment as shown in FIGS. 14A-14E, the entrance end plane A—A' has a substantially identical shape as the beam shape of a laser light beam and is divided into five segments 1100-1500 in the longitudinal direction of the beam shape, as can be seen from FIG. 14B. Each segment is further divided in a matrix form as shown in FIG. 14C. Since adjacent portions of these matrices present a strong coherence, optical fibers contained in each matrix have the same length, whereas the lengths of optical fibers are made different in adjacent matrices. The difference in the length of optical fibers is desired to be not less than a coherent length. It should be noted however that although the difference is below such a desired length, sufficient effects can be produced. In each of five divided segments, locations corresponding to each other, for example, 1111 and 1211; 1151 and 1251; and 1114 and 1214, as shown in FIG. 14C, comprise optical fibers of the same length, and these locations with the optical fibers of the same length are connected to the identical optical fibers such as 1111', 1211' and so on on the same little optical fiber bundle 110.

In this manner, laser light beams exiting from the respective little optical fiber bundles will not intervene with each other, so that substantially no variation in intensity of illumination is present on the reticle, thereby making it possible to realize exposure illumination which has uniform illuminance, a high light utilizing efficiency and a desired directivity. In this embodiment, the cross-sectional area of the optical fiber bundle is made equal to the cross-sectional area of a laser beam generated from the excimer laser. Specifically, since a cross-section of approximately 4×20 mm is sufficient, the object of the present invention can be economically achieved with a reduced number of optical fibers as compared with the case where a high-power mercury lamp is employed as a light source (20-30 mm$\phi$).

Figure 15:
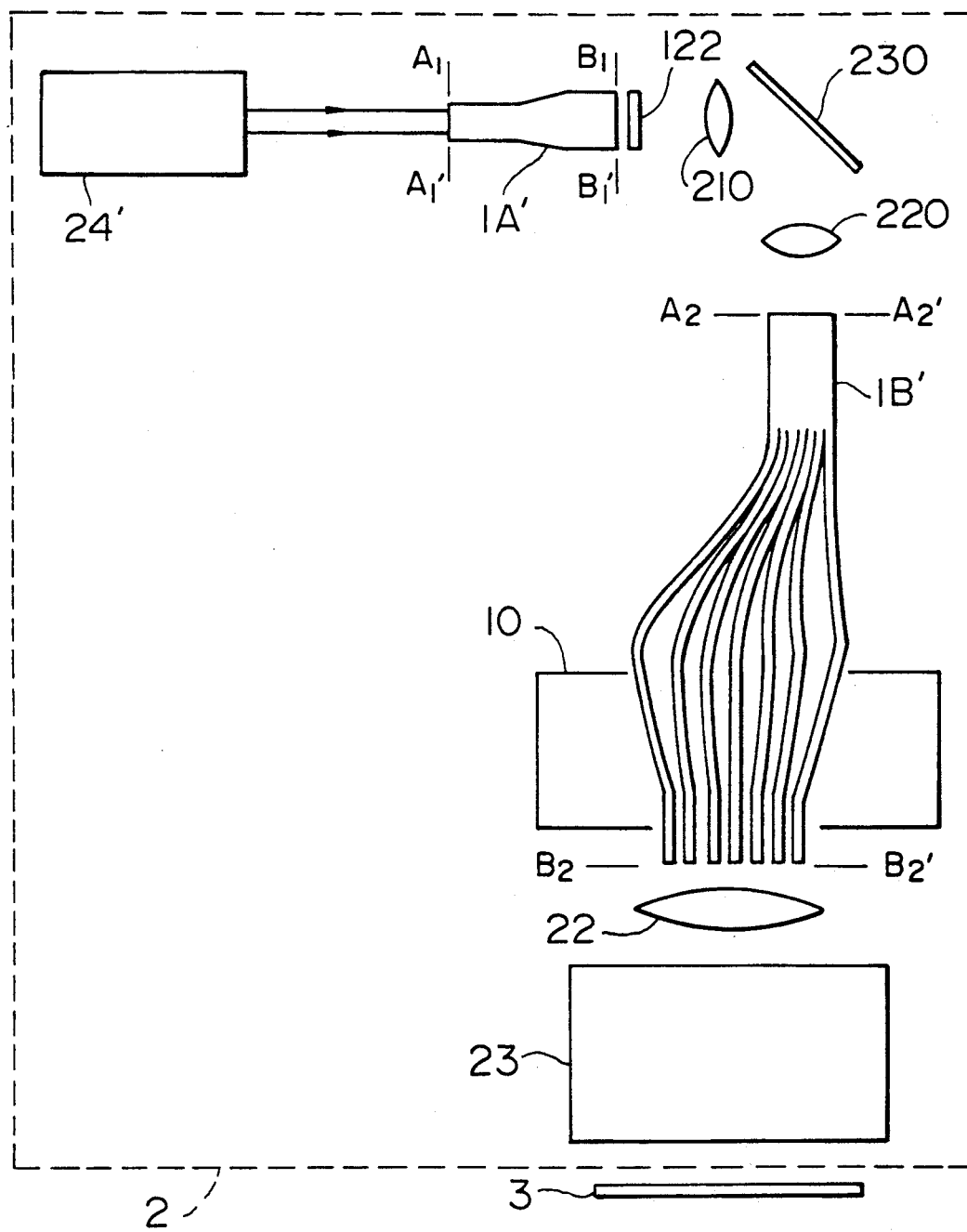
FIG. 15 illustrates the embodiment which employs two optical fiber bundles.
Figure 16A:
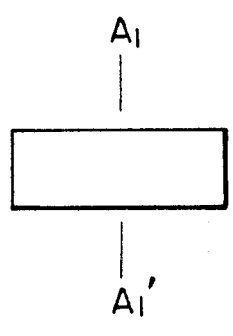
FIGS. 16A-16D are cross-sectional views of optical paths in the embodiment of FIG. 15.
Figure 16B:
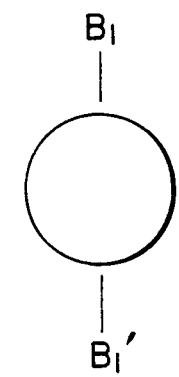
Figure 16C:
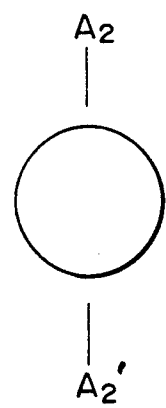
Figure 16D:
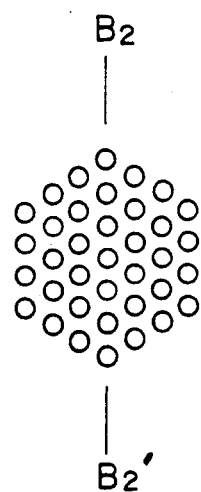
Figure 17A:
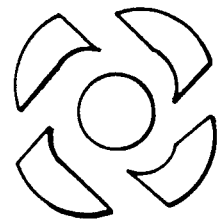
FIGS. 17A-17D show how outgoing ends of little optical fiber bundles of the present invention are changed by the mechanism for changing relative positions of little optical fiber bundles.
Figure 17B:
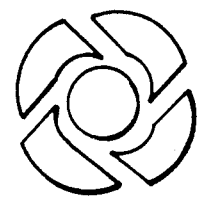
Figure 17C:
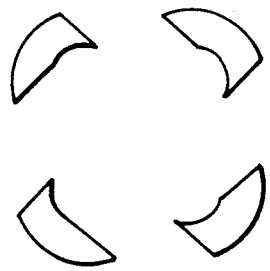
Figure 17D:
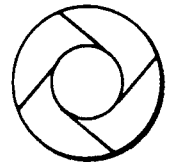

FIG. 15 illustrates an embodiment of the present invention wherein a portion having functions of reducing the coherence of laser light and reducing the directivity originally possessed by the laser is separated from a portion having a function of providing a desired directivity of illumination. Specifically, an optical fiber bundle 1A' has an entrance cross-section in a rectangular shape substantially identical to the cross-sectional shape of a laser beam generated by the foregoing excimer laser as shown in FIG. 15A and an outgoing end plane circular in shape as shown in FIG. 15B. The length of the optical fibers in the bundle is made not less than the coherent length so as to prevent laser beams exiting therefrom from intervening with each other. A group of small lenses are disposed opposite to the outgoing end of the optical fiber bundle 1A' so as to remove a high directivity of the laser beams. Dispersed light thus produced is converged by a lens into the entrance end plane of a second optical fiber bundle 1B' shown in FIG. 16C. The outgoing end plane $B_2$—$B_2'$ of the optical fiber bundle 1B' may be extended, as shown in FIG. 16D, by a mechanism 10 for changing relative positions of the little optical fiber bundles as desired. An optical path subsequent to the outgoing end planes of the little optical fiber bundles is identical in structure to the embodiment shown in FIG. 1.

FIGS. 17A-17E illustrate an example of an exposure illumination system in a projection exposure apparatus according to the present invention. A light source may be either a mercury lamp or an excimer laser. For example, the exposure apparatus of FIG. 5A is provided with an illumination system having the same structure as that in the vicinity of the entrance end of the optical fiber bundle shown in FIG. 6. The outgoing end of an optical fiber bundle 1" is separated into five little optical fiber bundles 11 as shown in FIGS. 17A-17D. Specifically, one of the little optical fiber bundles 11 is positioned in a central portion and the other four are positioned in a peripheral portion. The centrally positioned little optical fiber bundle is fixed, while the four peripheral bundles are securely mounted on radially slidable mechanisms. When a normal reticle with a relatively wide pattern width is used for exposure, the four peripheral little optical fiber bundles are relatively inwardly brought in a manner that light beams for exposure from all of the five little optical fiber bundles 11 are used for exposure. When a normal reticle with a relatively narrow pattern width is used for exposure, a cylindrical mirror 17 is inserted in front of the entrance end plane of the optical fiber bundle 1" on order of a control system 7 so as to reflect, on the side surfaces of the cylindrical mirror 17, a light beam directing to the optical fiber bundle located in the central portion of the outgoing end plane of the optical fiber bundle 1" to advance to the entrance ends of optical fibers which in turn lead the light beam to the four peripheral little optical fiber bundles. Further, the four peripheral little optical fiber bundles are moved outwardly by a mechanism 10 for changing relative positions of the little optical fiber bundles. In this manner, a ring-shaped illuminating beam is provided for exposing a wafer to a relatively narrow pattern without waste of the light beam. When a wafer is exposed to a very narrow pattern is to be exposed, the four peripherally positioned little optical fiber bundles are brought to the inward limits on order of the control system 7 such that light beams for exposure from all of the five little optical fiber bundles 11 are used for exposure. It will be appreciated that this example allows, in a simple structure, the illumination directivity to be readily changed in accordance with the shape and size of a pattern to be exposed and exposure to be performed without waste of the light beam.

Figure 18A:
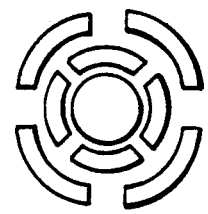
FIGS. 18A-18C show how outgoing ends of other little optical fiber bundles of the present invention are changed by the mechanism for changing relative positions of little optical fiber bundles.
Figure 18B:
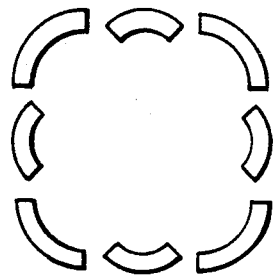
Figure 18C:
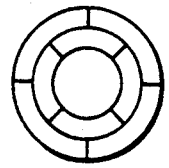

FIGS. 18A–18C illustrate an example of an exposure illumination system in the projection exposure apparatus according to the present invention. The outgoing end of an optical fiber bundle 1" is separated into nine little optical fiber bundles 11 as illustrated, one of which is placed in a central portion, four of which are placed around the central little optical fiber bundle, and the remaining four of which are placed around the four little optical fiber bundles. The central little optical fiber bundle is fixed, while the peripheral eight are securely mounted on a radially slidable mechanisms. The eight little optical fiber bundles are moved as shown in FIGS. 18A, 18B and 18C. In a ring-shaped illumination scheme shown in FIG. 18B, a cylindrical mirror 17 is inserted, as previously explained in connection with FIG. 6, to enable the realization of a desired directivity of exposure illumination and a maximum light utilizing efficiency in accordance with the resolution and the kind of a used reticle.

Figure 19:
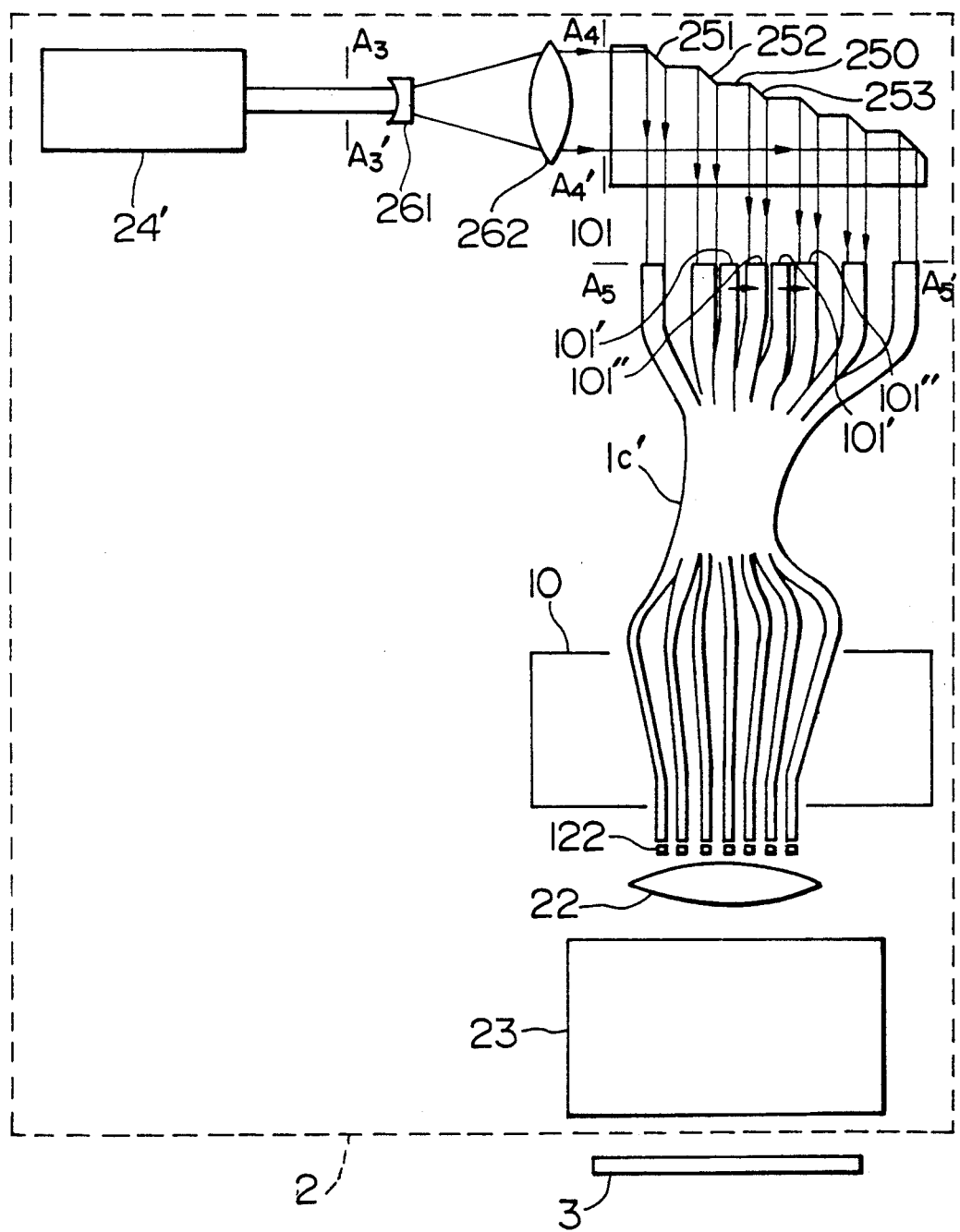
FIG. 19 illustrates a second case of the embodiment which employs a laser as a light source.
Figure 20A:
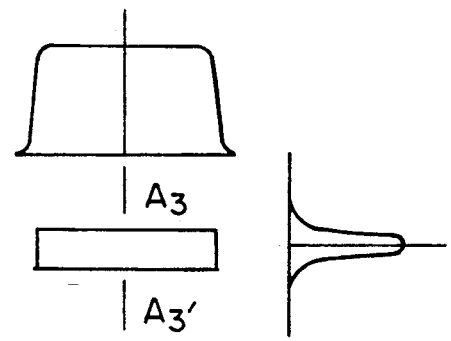
FIGS. 20A-20C illustrate cross-sectional views of light paths in the embodiment of FIG. 19.
Figure 20B:
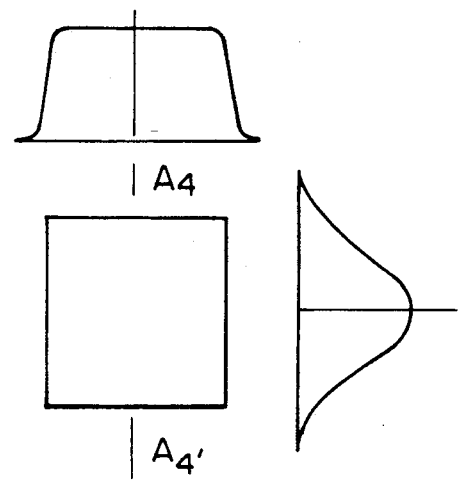
Figure 20C:
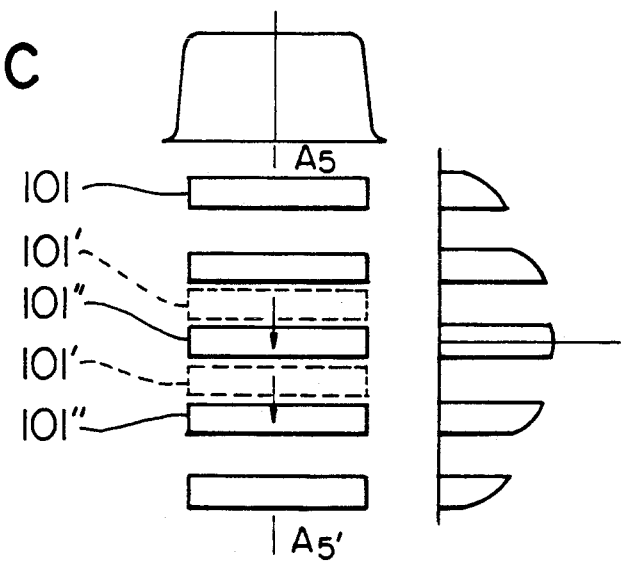

FIG. 19 illustrates another example of an exposure illumination system in the projection exposure apparatus according to the present invention. A laser beam emitted from a laser light source 24' presents a cross-section $A_3$—$A_3'$ which is long in the direction perpendicular to the sheet of FIG. 19 and short in the direction along the sheet, as shown in FIG. 20A. Since there are a small number of modes in the direction along the sheet, the coherence is strong. Rod lenses 261, 262 are used to extend the beam width in the direction along the sheet of FIG. 19 as a cross-section $A_4$—$A_4'$ shown in FIG. 20B. The extended beam is divided by a prism 250 for making optical path difference into six beams with different optical path lengths. The respective divided beams are led into an optical fiber bundle 1C' which has the entrance end plane divided into six segments. This entrance end plane $A_5$—$A_5'$ has an intensity distribution as shown in FIG. 20C. The entrance end plane of the optical fiber bundle 1C' consists of six separated rectangular planes as shown in FIG. 20C, wherein two fiber ends near the center of the plane are movable in the directions indicated by the arrows in the figure. Among a total of four movable fiber ends, fiver ends 101" and 101' shown in FIGS. 19 and 20 are respectively connected to a central portion and a peripheral portion of the outgoing ends 122 of the fibers. The rest of fixed entrance ends 101 are all connected only to peripherally located outgoing ends 122. In this manner, normal illumination with the value s being variable is realized when the entrance end plane is in a state (position) where a light beam is incident to the fiber end 101", and ring-shaped illumination is realized when the entrance end plane is in a state (position) where a light beam is incident to the fiber end 101'.

Figure 21:
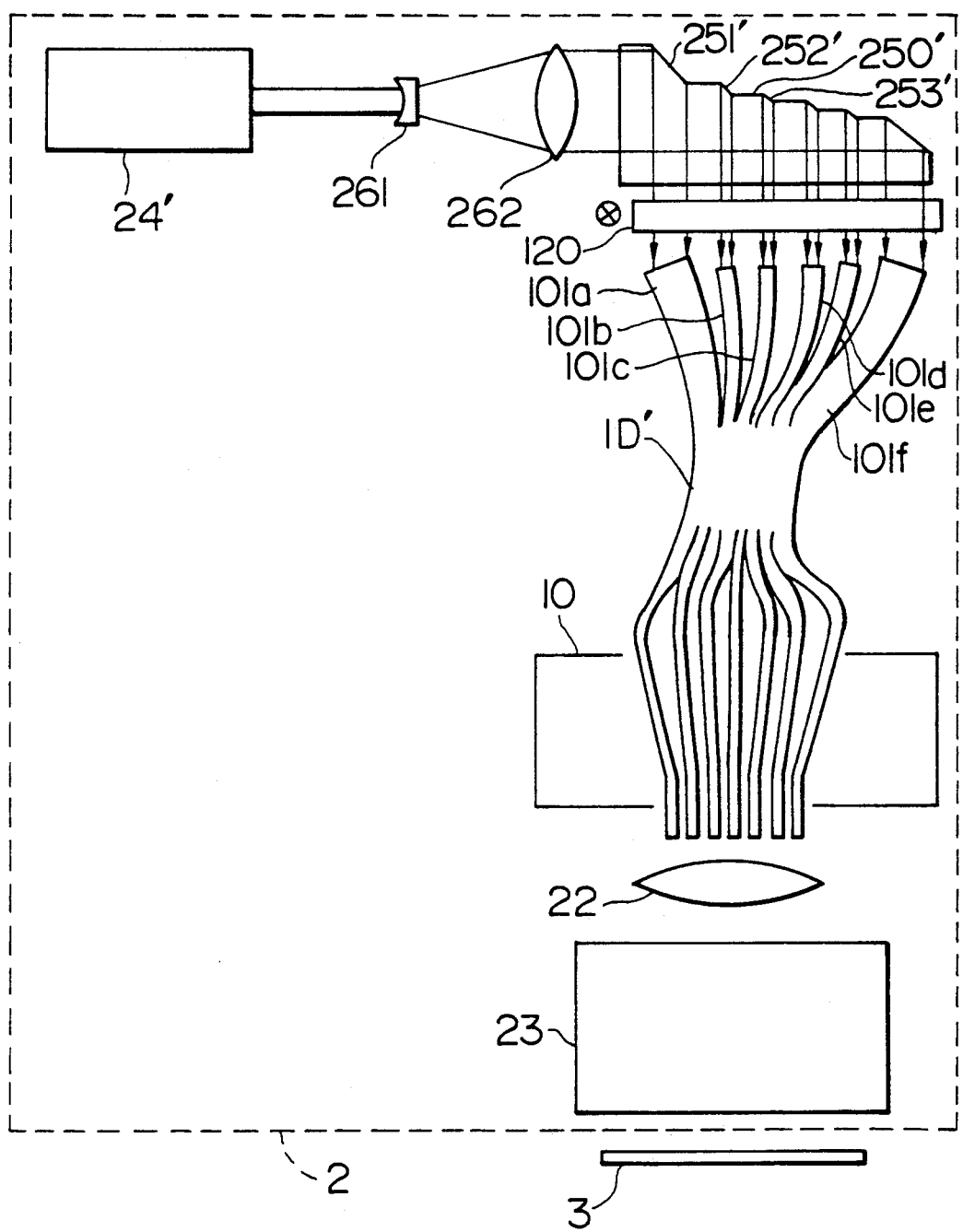
FIG. 21 illustrates a third case of the embodiment of an illumination apparatus which employs a laser as a light source.
Figure 22A:
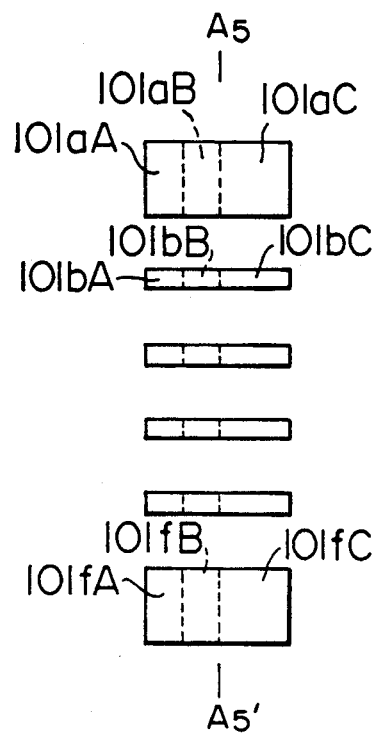
FIGS. 22A-22F illustrates cross-sectional views of light paths in the embodiment of FIG. 21.
Figure 22C:
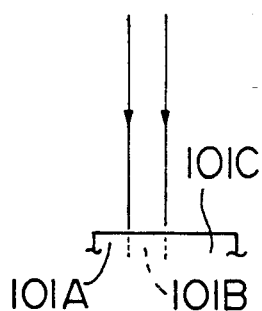
Figure 22D:
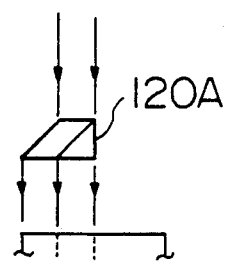
Figure 22E:
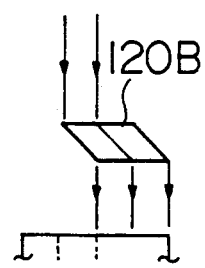
Figure 23A:
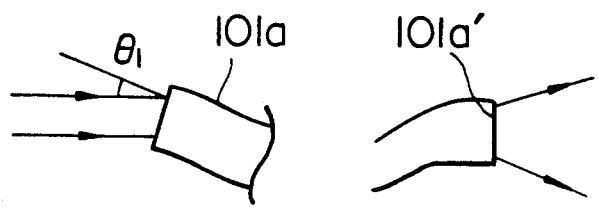
FIGS. 23A-23F illustrate incident angles of a light beam entering an optical fiber and outgoing angles (conditions of diverging light beams) for showing the principles of the embodiments shown in FIGS. 21 and 22A-2F.
Figure 23B:
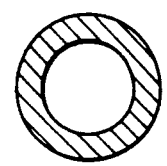

FIG. 21 illustrates an example of an exposure illumination system of the projection exposure apparatus according to the present invention. A laser light beam emitted from a laser light source 24' is enlarged to a desired size by rod lenses 261, 262, similarly to the example shown in FIG. 19, and then divided into six beams with different optical path lengths by a prism 250' for making optical path difference. This example differs from the example of FIG. 19 in that the sizes of the respective divided beams are different from each other. Specifically, the size of beams in a peripheral portion is larger than that of beams in a central portion. The beams exiting from this prism 250' for making optical path difference reach an optical path selecting prism 120, the cross-section of which is illustrated in FIGS. 22C, 22D and 22E. This prism 120 consists of two prisms 120A, 120B which are fixed spaced by a predetermined distance and integrally movable in the left and right directions on the sheet of FIGS. 22C–22E. The light beams passing through this optical path selecting prism 120 enter into the entrance ends of an optical fiber bundle 1D'. These entrance ends are formed in accordance with the sizes of the beams so that those receiving the peripheral beams are wide and those receiving the central beams are narrow. Also, as shown in FIGS. 21 and 22A, the end plane of this fiber bundle has the normal direction inclined with respect to the incoming light beams in the peripheral portion and parallel to the incoming light beams in the central portion. The relationship of an incident angle to the optical fiber end to an angle of an outgoing light beam with respect to the normal of the outgoing end plane will be explained with reference to FIGS. 23A–23F. Light beams incident to optical fibers 101a and 101f located in a peripheral portion and inclined by an angle $\theta_1$ with respect to the incident light beam, as shown in FIG. 23A, exit from outgoing ends 101a' and 101f' with a directivity having a constant angle range with respect to the normal of the outgoing end plane as shown in FIG. 23B. Specifically, an angle $\theta$ formed by the exiting light beam with the normal of the outgoing end plane is given by:

$$\theta_1 - \Delta\theta \leq \theta \leq \theta_1 + \Delta\theta$$

Figure 22F:
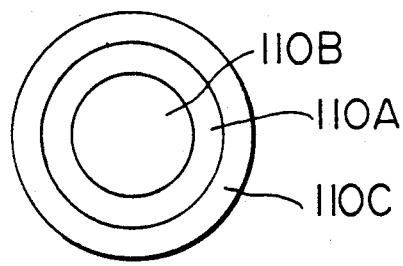
Figure 23C:
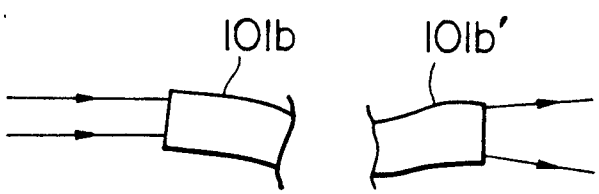
Figure 23D:
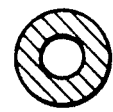
Figure 23E:
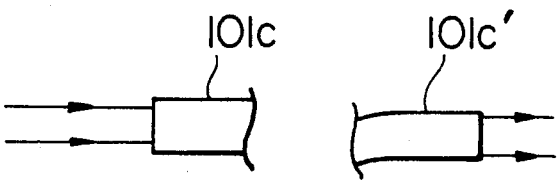
Figure 23F:

On the other hand, light beams entering perpendicularly into central optical fibers 101c and 101d are exiting from the outgoing end with its chief beam being slightly extended substantially vertically to the outgoing end, as shown in FIG. 23E. Also, light beams incident to optical fibers 101b and 101e placed in an intermediate location between the peripheral portion and the central portion exit with its width extended less than the beam shown in FIG. 23A but more than the beam shown in FIG. 23E, as illustrated in FIG. 23C. Since there is such a relationship between an incident angle to an optical fiber and the directivity of an emitted light beam, if the entrance end is connected to the outgoing end as shown below, a desired light beam with a uniform directivity is averagely obtained from each location on the outgoing end plane, thereby making it possible to uniformly illuminate a reticle. Specifically, each entrance end of the optical fiber bundle 1D', for example, 101a is divided into three segments 101aA, 101aB and 101aC, as shown in FIG. 22A. Then, the segment 101aA is connected to a portion 110A which is placed at a location between the central and peripheral portions on the outgoing end 110 of the optical fibers, as shown in FIG. 22F. Similarly, the segment 101aB is connected to a portion 110B and the segment 101aC to a portion 110C. An entrance end 101b of optical fibers likewise has a segment 101bA connected to the portion 110A; a segment 101bB to the portion 110B; and a segment 101aC to the portion 110C. When the optical path selecting prism 120 is in a state shown in FIG. 22C, light beams exiting from the prism 250' for generating optical path length difference enter into segments 101aB, 101bB, 101cB, 101dB, 101eB and 101fB on the entrance end plane of the optical fiber bundle and exit only from the outgoing end 101B of the optical fibers. As has been explained in connection with FIGS. 23A–23F, although a light beam incident to the entrance end of the optical fiber bundle presents a high directivity, it is possible to provide this light beam exiting from the outgoing end with a desired directivity. Further, since the light beam exits only from the outgoing end 101B of the optical fibers, a phase shift reticle 3 is illuminated by a light beam for exposure with a high directivity, i.e., with the value $\sigma$ being small.

Figure 22B:
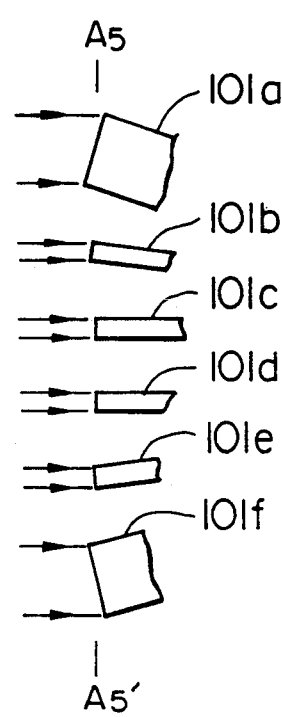

When the reticle is replaced by one having a normal line width, the optical path selecting prism 120 is moved such that the prism 120A is positioned as shown in FIG. 22B. By thus positioning the prism 120A, light beams simultaneously enter into the entrance end segments 101aA and 101aB of the optical fiber bundle. Light beams likewise enter into two segments also in the other entrance ends of the optical fiber bundles. Since these two segments are connected to outgoing ends 110A and 110B, an illuminating light with a moderate directivity is provided. Therefore, if the mechanism 10 for moving relative positions of the little optical fiber bundles is driven to obtain an optimal directivity for the foregoing reticle with a normal line width, an optimal exposure can be realized for this line width pattern.

When a reticle 3 which is not a phase shift reticle but one including a pattern close to a resolution limit of a reduction projection lens is mounted in the exposure apparatus, the optical path selecting prism 120 is moved as shown in FIG. 22E such that the prism 120B is positioned within the optical path and light beams enter into entrance end segment 101aC and so on of the optical fiber bundle. In this manner, the light beams entering from the respective entrance end segments of the optical fiber bundle exits from the outgoing end portion 110C located in the outer peripheral portion on the outgoing end plane of the optical fibers, which results in realizing the ring-shaped illumination and enabling a pattern close to the resolution limit to be imaged in a satisfactory pattern shape.

Figure 24A:
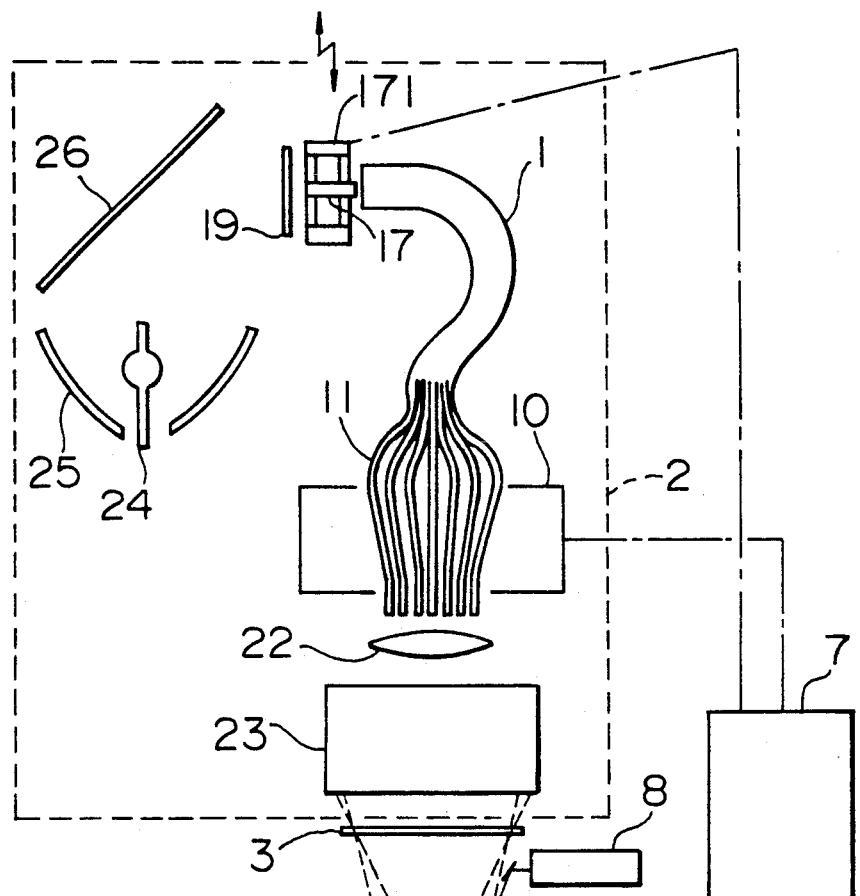
FIGS. 24A and 24B illustrate an embodiment of a reduction projection exposure apparatus based on the first embodiment of the present invention, wherein a variable filter is mounted on the position of the entrance pupil of a reduction exposure lens.
Figure 24B:
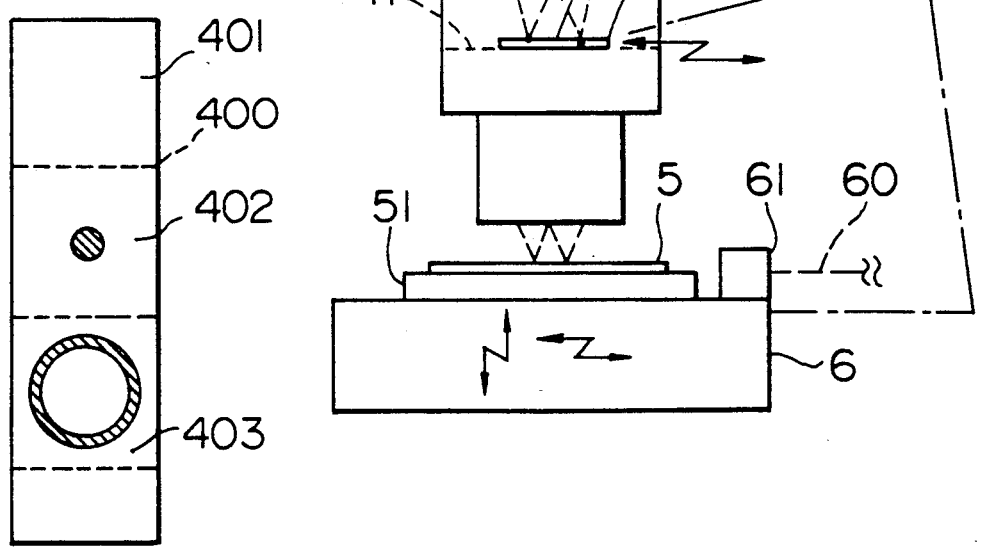

FIG. 24A illustrates a reduction projection exposure apparatus to which the first embodiment of the present invention is applied. Reference numerals in this figure identical to those in FIGS. 5A, 5B and 6 designate the same constituents. An illumination system 2 may be either of the foregoing embodiments. In a reduction projection lens 4', a variable filter 400 is inserted on an entrance pupil 41' for partially shielding or reducing a transmitting light amount of light passing therethrough only in a desired region. The variable filter 400 consists of three parts 401, 402 and 403, for example, as shown in FIG. 24B, and is movable so as to position each part on the pupil of the reduction projection lens 4', as shown in FIG. 24A. With a reticle on which a pattern is drawn with a normal line width, the mechanism 10 for changing relative positions of little optical fiber bundles is driven to set the value $\sigma$ to 0.5 ($\sigma = 0.5$), and the variable filter 400 is moved to position the part 401 on the pupil. When exposure is performed using a reticle with a thin pattern line width, a cylindrical mirror 17 disposed near the entrance end of an optical fiber bundle 1 is inserted in an optical path, while the mechanism 10 for changing relative positions of little optical fiber bundles is driven to extend the outgoing ends of the little optical fiber bundles, to provide ring-shaped illumination. Further, the variable filter 403 is moved to position the part 403 on the pupil. Since the part 403 has the shape and size substantially identical to those of a secondary light source image on the pupil of the ring-shaped illumination, this part is used for a circuit pattern in which thin pattern lines are mixed with fat pattern lines to expose both pattern lines with a relatively high resolution. By thus providing the variable filter on the pupil of the reduction projection lens, the exposure apparatus can attend to a larger number of patterns.

Figure 25:
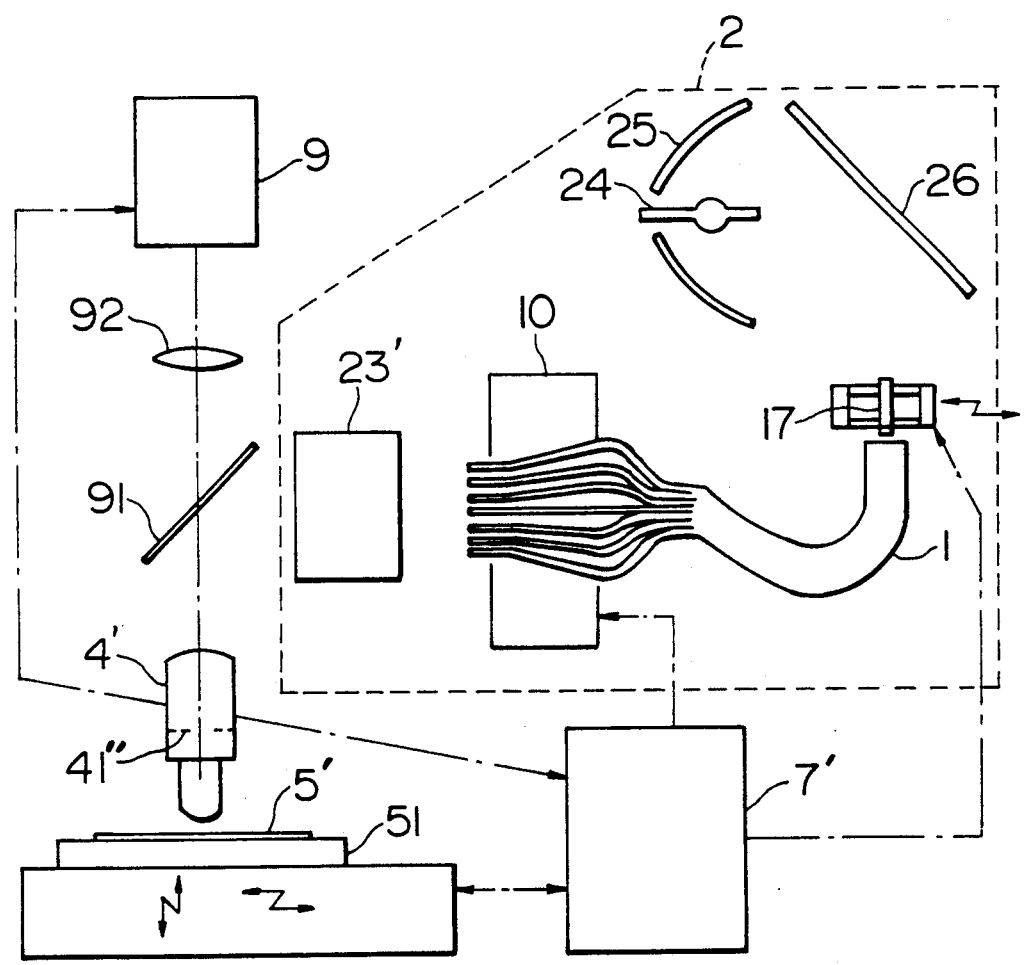
FIG. 25 illustrates an embodiment of a pattern testing apparatus to which an illumination apparatus of the present invention is applied.

FIG. 25 illustrates that the illumination system according to the first embodiment of the present invention is applied to a pattern testing apparatus. Reference numerals in this figure identical to those in FIGS. 5A, 5B, 6 and 24 designate the same constituents. Light beams exiting from outgoing ends of little optical fiber bundles pass through a condenser lens 12", are reflected by a half mirror 91, and then form an image of the outgoing ends of the little optical fiber bundles on a pupil 41" of an objective lens 4". The ratio $\sigma$ of this image to the outer diameter of the pupil 41" is the partial coherency of the illumination in pattern detection. When the outgoing end area of the little optical fiber bundles is changed by driving the mechanism 10 for changing relative positions of little optical fiber bundles, the value $\sigma$ can be changed. For example, the value $\sigma$ is set to approximately one, when a pattern has a granular surface, to decrease the directivity of the illuminating light beam, thereby making it possible to detect the pattern with smaller noise. Conversely, for a pattern with less ununiformity, the value $\sigma$ may be set to be small to raise a low contrast, thereby allowing a signal to be readily detected. Further, when it is desired to detect a pattern with its edges being emphasized, the cylindrical mirror 17 may be inserted in the optical path to provide the ring-shaped illumination, whereby the edge portions are emphasized. Furthermore, though not shown in the figure, if a ring-shaped stopper as indicated by 403 in FIG. 24B is inserted at the position of the pupil of the objective lens 4", similarly to the exposure apparatus shown in FIG. 24A to which the first embodiment of the present invention is applied, so-called dark field illumination is provided, thereby obtaining a dark field image in which pattern edge portions alone are bright. In this way, when the illumination apparatus of the present invention is employed in a pattern detecting system, optimal illumination can be readily provided on order of a control system 7, in accordance with the kind of a pattern to be detected while reducing waste of the light beam.

It should be noted that the mechanism 10 for changing relative positions of little optical fiber bundles is not limited to the example shown in FIG. 2 but may be driven so as to realize a desired illumination directivity for every case only by means of this mechanism 10 without employing optical parts for the ring-shaped illumination as shown in FIGS. 6 and 8. It is also apparent that the positional changes of the little optical fiber bundles are not limited to be in the radial direction as shown in the foregoing embodiments but may be in a spiral or non-linear form.

As described above in connection with the first embodiment, the present invention is implemented in an illumination system for use in exposure, test, display and so on of patterns to readily provide optimal illumination in the relationship between the shape and size of a particular pattern to be exposed, tested or displayed and optical systems used for such exposure, testing and display in a relatively simple structure as well as to easily modify the optimal illumination in accordance with changes in the optical systems. Thereby, illuminating light of a conventional fixed illumination system need not be partially shielded, and a desired illumination directivity and illuminating light distribution can be realized without decreasing the light utilizing efficiency, thereby providing an exposure apparatus or a testing apparatus presenting a large throughput. Also, a display unit can provide a clear display or only requires a light source with a smaller power for the same brightness as before.

Next, a second embodiment of the present invention will be described with reference to FIGS. 26–36.

Figure 26:
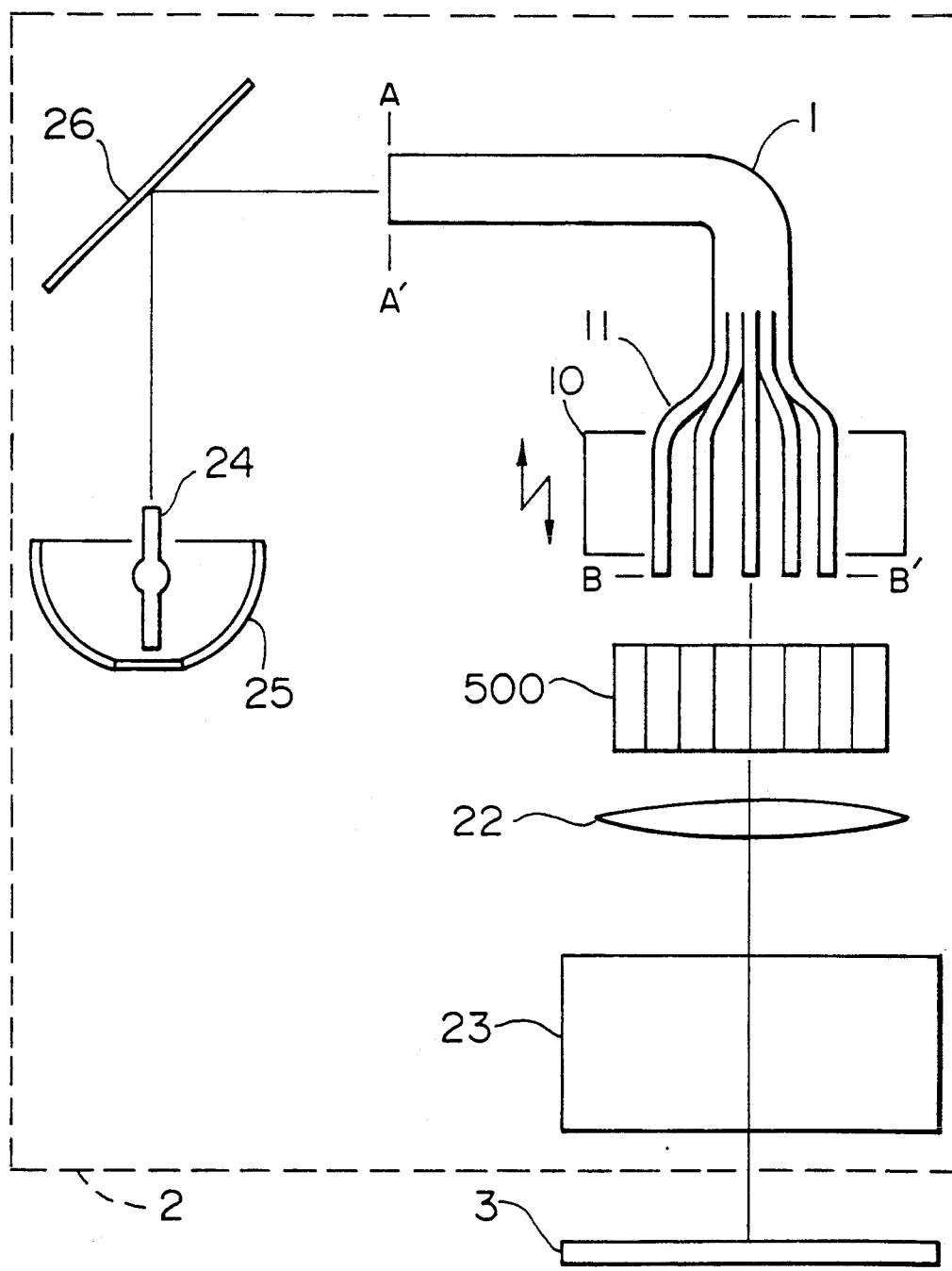
FIG. 26 illustrates a projection exposure apparatus which comprises the exposure illumination system based on a second embodiment of the present invention.
Figure 27A:
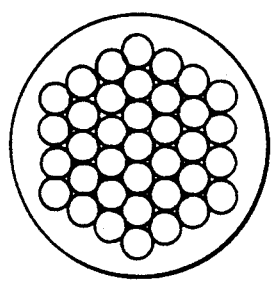
FIGS. 27A-27D are diagrams for explaining several cases where relative positions of the little optical fiber bundles shown in FIG. 26 are changed.
Figure 27B:
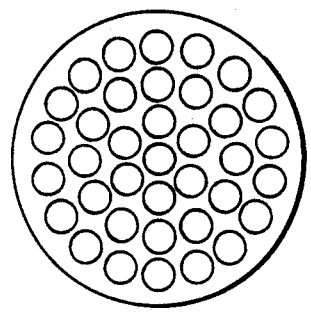
Figure 27C:
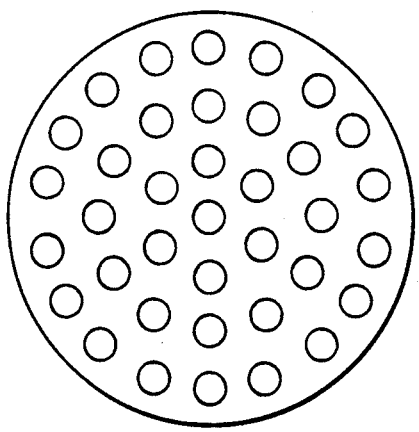
Figure 27D:
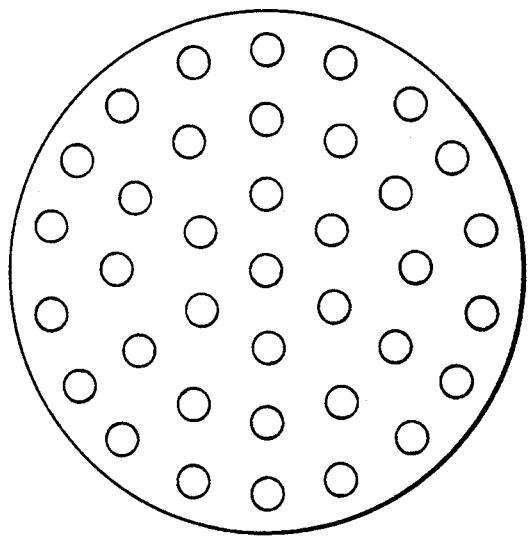

FIG. 26 illustrates an exposure illumination apparatus 2 according to a second embodiment of the present invention. A light beam emitted from a mercury lamp 24 is reflected by an elliptical mirror 25, further reflected by a chromatic mirror 26 for selecting wave band for selectively reflecting a desired wave band of exposing light, for example, an i-line, and then enters into an entrance plane A—A' of an optical fiber bundle 1. The optical fiber bundle 1 comprising a multiplicity of bundled optical fibers is branched into a plurality of little optical fiber branches 11 at a location a predetermined distance away from the entrance end thereof. For example, the diameter of a single optical fiber is approximately 0.2 mm and the diameter of the bundle 1 is approximately 30 mm. Outgoing end planes of the plurality of branched little optical fiber bundles 11 are changed their relative positions in a outgoing plane B—B' of the little optical fiber bundles by a mechanism 10 for changing relative positions of the little optical fiber bundles. Light beams exiting from the respective little optical fiber bundles 11 enter into a rod lens group 500 which serves as converging and diverging optical system. Since the diameter of a light beam incident to the rod lens group 500 can be varied by the little optical fiber bundles 11, it is possible to arbitrarily set the shape and size of a secondary light source which is formed in the vicinity of an outgoing plane of the rod lens group 500, which leads to readily changing the partial coherency σ of illumination without decreasing the light utilizing efficiency. A light beam exiting from the rod lens group 500 passes through an output lens 22, similarly to an illumination system employed in a normal semiconductor exposure apparatus, and then illuminates a reticle 3 or an object to be exposed, through a condenser lens 23.

FIG. 27 illustrates a state of the outgoing plane when the relative positions of the little optical fiber bundles 11 are changed by using the mechanism 10 for changing the relative positions of the little optical fiber bundles in the exposure illumination apparatus shown in FIG. 27. By thus changing the relative positions of the little optical fiber bundles 11, the diameter of a light beam incident to the rod lens group 500 can be changed responsively. In accordance with this, the size of the secondary light source formed in the vicinity of the outgoing plane of the rod lens group 500 can be arbitrarily changed, thereby making it possible to freely set the partial coherency σ of illumination, which further results in providing an illumination optical system presenting a high illumination efficiency because of less waste of the exposing light. Thus, the mechanism 10 for changing the relative positions of the little optical fiber bundles is driven to change the relative positions in the outgoing plane B—B' of the little optical fiber bundles so as to set the partial coherency σ, for example, to approximately 0.6 when a normal reticle is used, and to approximately 0.4 when a phase shift reticle is used.

Figure 28:
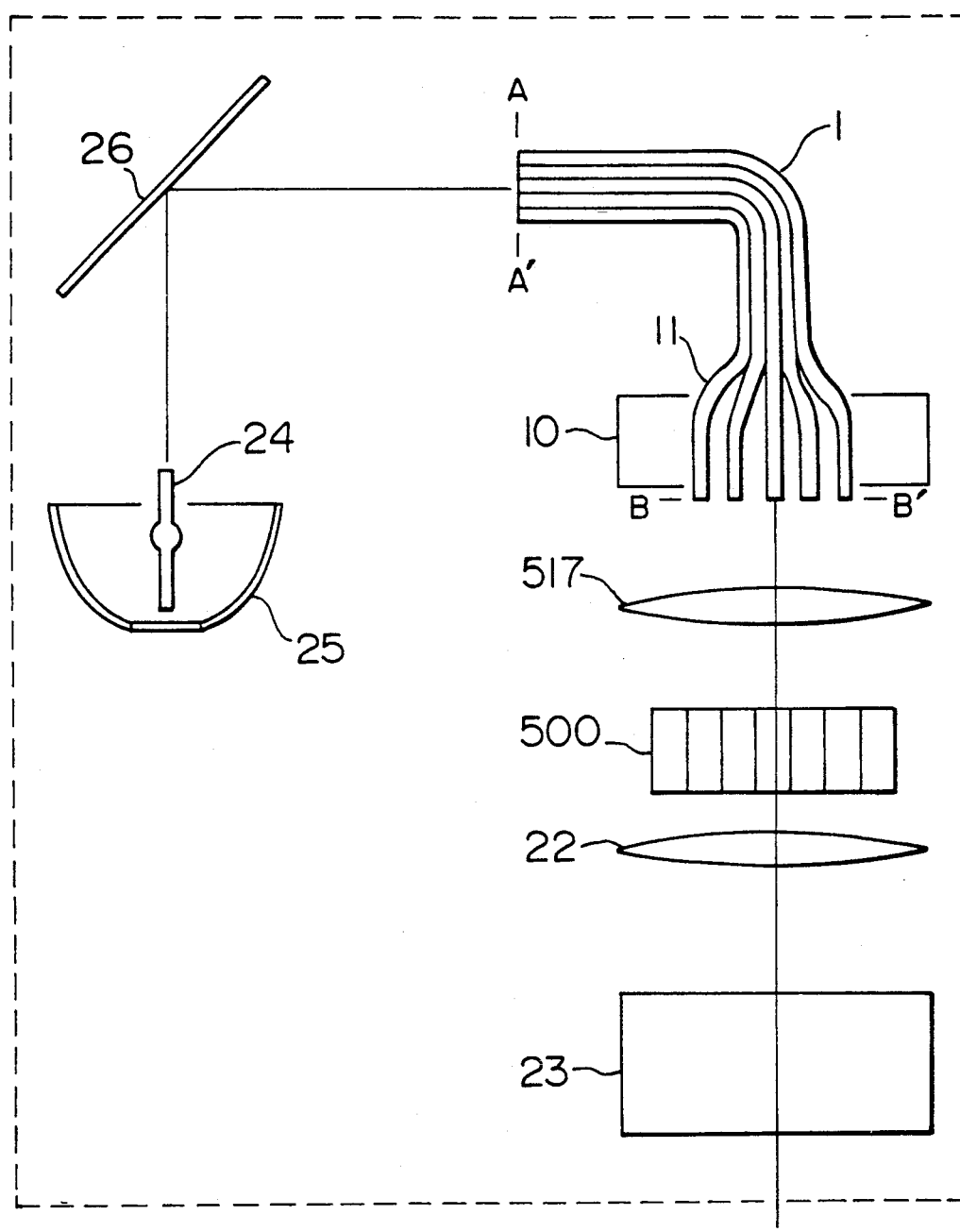
FIG. 28 illustrates a projection exposure apparatus which comprises the exposure illumination system based on the second embodiment of the present invention.

FIG. 28 illustrates the exposure illumination apparatus 2 shown in FIG. 26, wherein the outgoing plane of the little optical fiber bundles 11 is located at the front side focus position of an optical lens 517, and the entrance plane of the rod lens group 500 is set at the rear side focus position of the same, in order to set the outgoing plane B—B' of the little optical fiber bundles 11 and the entrance plane of the rod lens group 500 as a converging and diverging optical system at infinite distant positions. Stated another way, the outgoing plane B—B' of the little optical fiber bundles 11 and the entrance plane of the rod lens group 500 as the converging and diverging optical system may be placed in the infinitely distant positional relationship. The rest of the structure is similar to that of FIG. 26. In this way, the intensity of a light beam incident to the rod lens group 500 becomes uniform, so that the reticle 3 or the object to be exposed can be uniformly illuminated.

Figure 29:
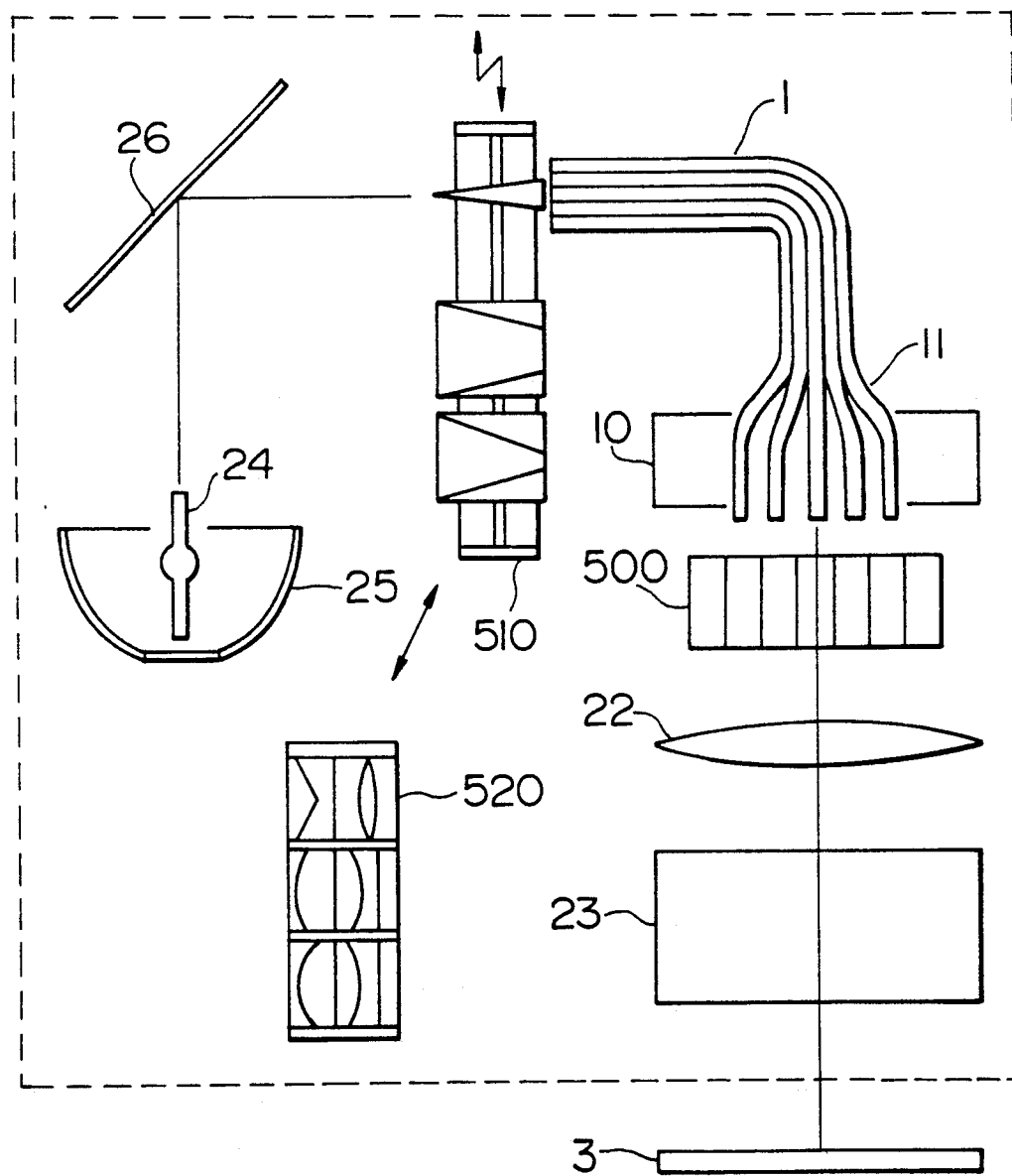
FIG. 29 illustrates a projection exposure apparatus which comprises an illumination modifying means based on the second embodiment of the present invention.
Figure 30A:
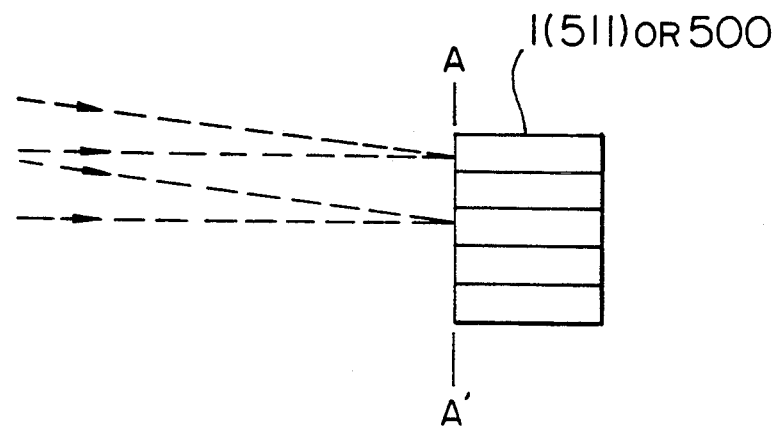
FIGS. 30A-30F illustrate examples of illumination modifying means utilizing reflection according to the second embodiment of the present invention.
Figure 30D:
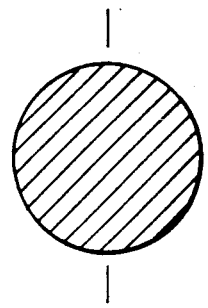
Figure 30B:
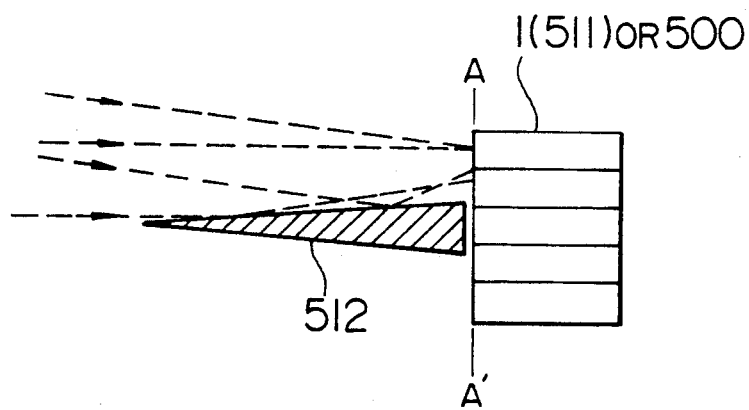
Figure 30E:
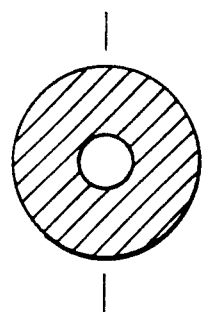
Figure 30C:
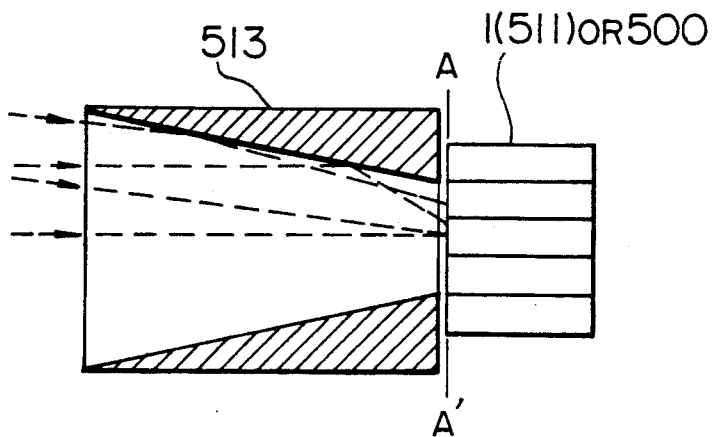
Figure 30F:
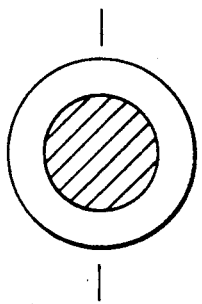

FIG. 29 illustrates that the exposure illumination apparatus 2 shown in FIG. 26 is provided with a reflection modification mechanism 510 which utilizes reflection of a light beam to modify the diameter of the light beam when entering into the entrance plane A—A' of the optical fiber bundle 1. A light beam emitted from the mercury lamp 24 is reflected by the elliptical mirror 25 to enter into the optical fiber bundle 1. At this time, a mirror formed with a tapered hole, the inner surface of which presents a high reflectivity, is disposed on the entrance plane of the optical fiber bundle to allow light beams which would otherwise enter into a peripheral portion of the optical fiber bundle 1 to enter into a central portion of the same, whereby outgoing light beams exit only from centrally located little optical fiber bundles 11, and accordingly only these outgoing light beams from the central portion enters into the rod lens group 500. Therefore, a secondary light source formed in the vicinity of the outgoing plane of the rod lens group 500, serving as a converging and diverging optical system, is formed only in a central portion of the rod lens group 500, thereby making it possible to change the partical coherency σ without wasting the illuminating light beam. Also, by disposing a refraction modification mechanism 520 which utilizes the refraction of a light beam to modify the diameter of the light beam when entering into the entrance plane A—A' of the optical fiber bundle 1, it is also possible to change the partial coherency σ without wasting the illuminating light beam.

FIG. 30 illustrates that in the exposure illumination apparatus 2 a reflection modification mechanism 510 is employed to modify the diameter of a light beam incident to the optical fiber bundle 1 (511). For example, as shown in FIGS. 30A and 30D, an optical system is designed in a manner that a light beam would enter into the entire entrance plane of the optical fiber bundle 1 if the reflection modifying mechanism 510 were not disposed. Then, a light beam reflection modifying mirror 512 having a centrally conical shape is disposed in this optical system as shown in FIGS. 30B and 30E to reflect light beams, otherwise converging into a central portion, toward a peripheral portion so that a ring-shaped light beam enters into the optical fiber bundle 1 (511). Alternatively, when a light beam reflection modifying mirror 513 having a peripherally conical shape is disposed in the optical system as shown in FIGS. 30C and 30F, light beams otherwise converging into a peripheral portion will enter into the optical fiber bundle 1 (511) as a circular light beam. Further, for arbitrarily changing the diameter of a light beam incident to the optical fiber bundle 1, the tapering degrees of the reflection modifying mirrors 512, 513 may be set to appropriate values.

Figure 31A:
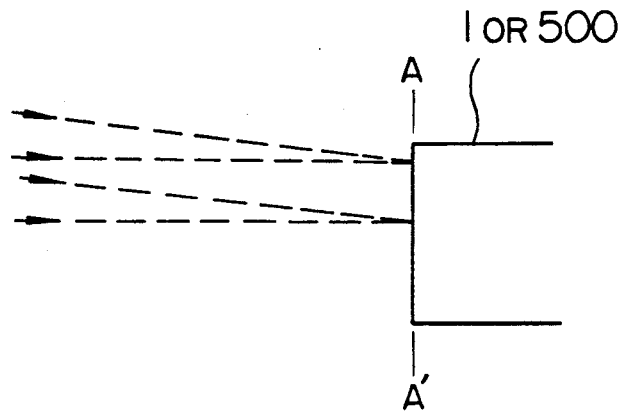
FIGS. 31A-31F illustrate examples of illumination modifying means utilizing refraction according to the second embodiment of the present invention.
Figure 31D:
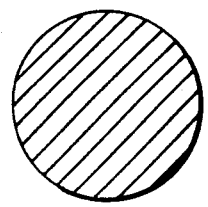
Figure 31B:
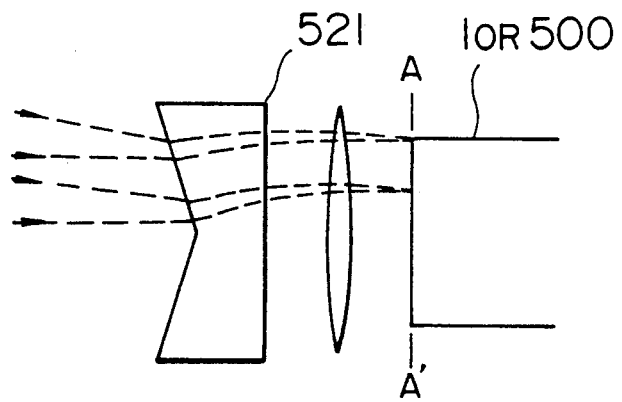
Figure 31E:
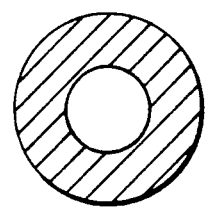
Figure 31C:
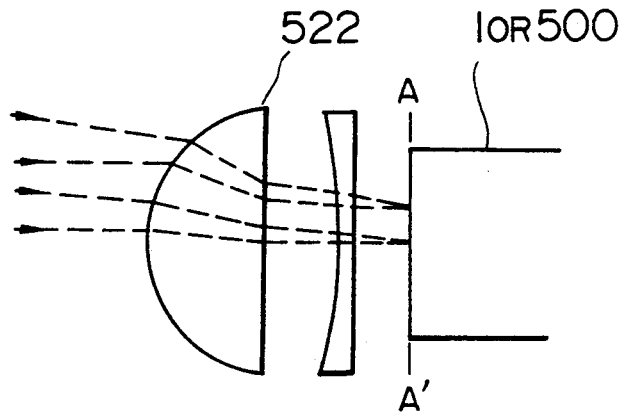
Figure 31F:
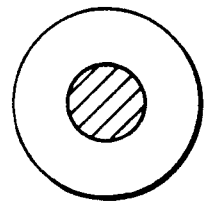

FIGS. 31A–31F illustrate that the refraction modification mechanism 520 is employed to change the diameter of a light beam incident to the optical fiber bundle 1 in the exposure illumination apparatus 2 shown in FIG. 26. For example, as shown in FIGS. 31A and 31D, an optical system is designed in a manner that a light beam would enter into the entire entrance plane of the optical fiber bundle 1 if the refraction modification mechanism 520 were not disposed. Then, when a prism 521 is disposed in front of the entrance plane of the optical fiber bundle 1 in this optical system as shown in FIGS. 31B and 31E, light beams, otherwise converging into a central portion of the entrance plane, is refracted toward a peripheral portion of the same and enter into the optical fiber bundle 1 through a lens for collimating light beams inclined with respect to the optical axis. In this manner, the light beams are forced to enter only into the peripheral portion of the optical fiber bundle, thereby providing a ring-shaped light beam without wasting the illuminating light beam. Alternatively, if a lens 522 which acts to compress light beams is disposed in place of the prism 521 as shown in FIGS. 31C and 31F, light beams otherwise converging into a peripheral portion can be refracted to enter into a central portion of the optical fiber bundle 1 as a circular light beam. Incidentally, for arbitrarily changing the diameter of a light beam incident to the optical fiber bundle 1, the focal length of the lens 522 may be set to an appropriate value.

Although the above illustrated reflection modifying mirrors 512, 513 and prisms 521, 522, serving as means for modifying light beams are most effective when they are disposed in front of the entrance plane of the optical fiber bundle 1, similar effects can be produced if they are disposed in front of the entrance plane of the rod lens group 500 serving as a converging and diverging optical system. Thus, they may be disposed in front of the entrance plane of either the optical fiber bundle 1 or the rod lens group 500.

Figure 32A:
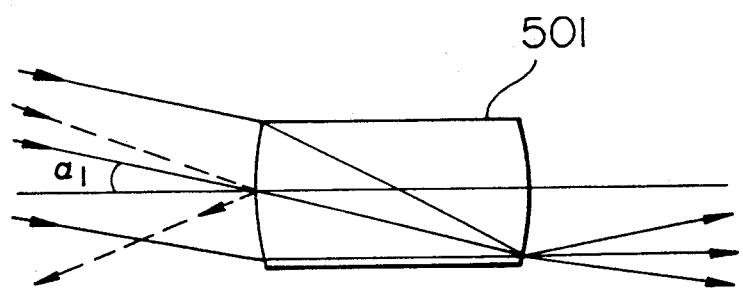
FIGS. 32A and 32B are explanatory diagrams for showing the rationalization of a rod lens according to the second embodiment of the present invention.
Figure 32B:
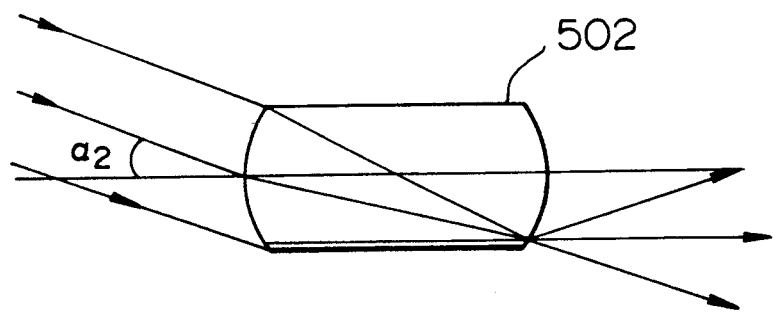

In the embodiment shown in FIG. 29, when the reflection modification mechanism 510 or the refraction modification mechanism 520 is disposed, the inclination of a light beam becomes larger to excess an inclination limit to which the light beam can transmit the rod lens group 500, thereby increasing the possibility of wasting the light beam. To solve this problem, a means as shown in FIG. 32 may be employed. Specifically, as shown in FIG. 32A, when the reflection modification mechanism 510 or the refraction modification mechanism 520 is not disposed, a maximum incident angle of a light beam is $\alpha_1$. Normally, a rod lens 501 is designed using a numerical aperture (NA) given by $NA = \sin \alpha_1$. However, when the reflection modification mechanism 510 or the refraction modification mechanism 520 is disposed, the inclination of the light beam becomes larger so that a maximum incident angle $\alpha_2$ of this case is wider than the maximum incident angle $\alpha_1$, wherein the employment of the normal rod lens 501 will cause waste of light, for example, due to reflection of light beams on the entrance plane of the lens, and accordingly result in a lower light utilizing efficiency. To attend to this problem, individual rod lenses 502 constituting the rod lens group 500 may be designed with the numerical aperture given by $NA = \sin \alpha_2$ to prevent such waste of light beams. It should be noted, however, that if the numerical aperture of the rod lens group 500 is changed, the design of the output lens 22 and the condenser lens 23 must be also changed.

Figure 33:
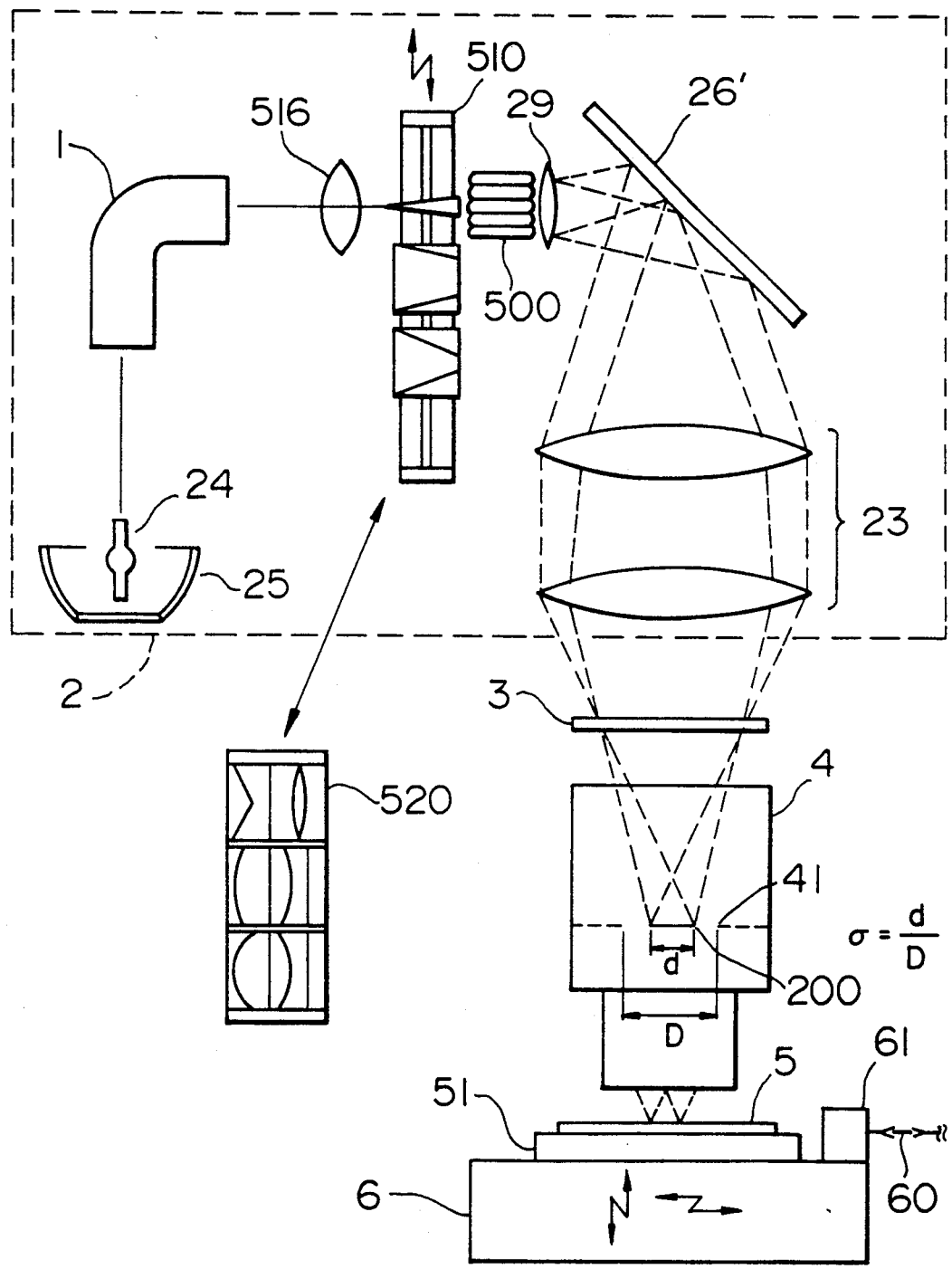
FIG. 33 illustrates a projection exposure apparatus which comprises an illumination modifying means based on the second embodiment of the present invention.

FIG. 33 illustrates a first case where the illumination modifying means according to the second embodiment of the present invention is applied to a projection exposure apparatus. A light beam, for example, an i-line emitted from a mercury lamp 24 enters into an optical fiber bundle 1, exits from an outgoing plane thereof, and refracted by a lens 516 to enter into a rod lens group 500. The lens 516 acts to define a conjugated positional relationship between the outgoing plane of the optical fiber bundle 1 and the entrance plane of the rod lens group 500. A reflection modification mechanism 510 or a refraction modification mechanism 520 is disposed in front of the entrance plane of the rod lens group 500 to modify the shape of a secondary light source formed in the vicinity of the outgoing plane of the rod lens group 500. A light beam diverged from the second light source transmits a condenser lens 23 and Keller illuminates a reticle 3 uniformly to form a secondary light source image 200 at the position of an entrance pupil of a reduction projection lens 4. Thus, it is possible to arbitrarily set the partial coherency $\sigma$ of illumination represented by the ratio of the diameter d of the secondary light source image 200 formed at the position of an entrance pupil 41 to the diameter D of the entrance pupil 41 of the reduction projection lens 4. After setting the exposure illumination system 2 to appropriate optical conditions, a circuit pattern formed on the reticle 3 is aligned with a pattern which has been transferred on a wafer 5 in the previous exposing process, so that a laser beam 60 for measuring purpose and a wafer driving stage 6 are used to drive the wafer 5 which is absorptively fixed on a wafer chuck 51.

Figure 34:
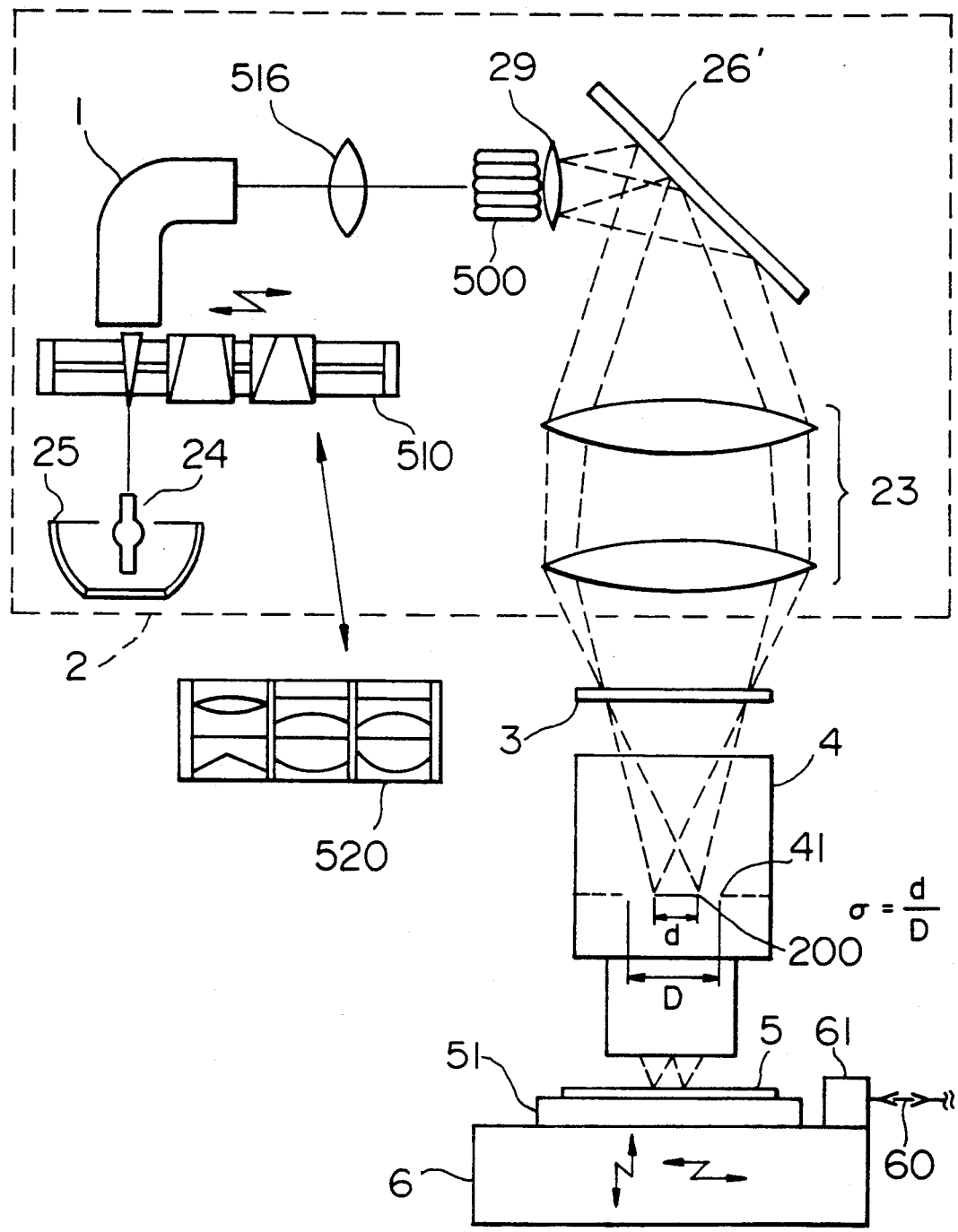
FIG. 34 illustrates a projection exposure apparatus which comprises an illumination modifying means based on the second embodiment of the present invention.

FIG. 34 illustrates a second case where the illumination modifying means according to the second embodiment of the present invention is applied to the projection exposure apparatus. A light beam, for example, an i-line emitted from a mercury lamp 24 enters into an optical fiber bundle 1 and exits from an outgoing plane thereof, and then is refracted by a lens 516 to be incident to a rod lens group 500. The lens 516 acts to define a conjugated positional relationship between the outgoing plane of the optical fiber bundle 1 and the entrance plane of the rod lens group 500. A reflection modification mechanism 510 or a refraction modification mechanism 520 is disposed in front of the entrance plane of the rod lens group 500 to modify the shape of a secondary light source formed in the vicinity of the outgoing plane of the rod lens group 500. In this manner, it is possible to arbitrarily set the partial coherency $\sigma$ of illumination represented by the ratio of the diameter d of a secondary light source image 200 formed at the position of an entrance pupil 41 to the diameter D of the entrance pupil 41 of a reduction projection lens 4.

FIGS. 35A and 35B illustrate an example where tree lenses are disposed in an optical path from the outgoing plane of the optical fiber bundle 1 to the entrance plane of the rod lens group 500 in the exposure illumination apparatus 2 according to the second embodiment of the present invention to provide a zoom lens mechanism 53 for arbitrarily changing the diameter of a light beam incident to the rod lens group 500. Assuming that the focal lengths of a first lens, a second lens and a third lens positioned in this order from the optical fiber bundle 1 are respectively represented by $f_1$, $f_2$, and $f_3$; the diameter of the outgoing plane of the optical fiber bundle 1 by $d_1$; and the diameter of a light beam incident to the rod lens group 500 by $d_2$, when the lenses having the focal lengths $f_1$ and $f_2$ are shifted in parallel with the optical axis to satisfy an equation shown in FIGS. 35A and 35B, the diameter of a light beam incident to the rod lens group 500 can be arbitrarily changed. In this manner, the partial coherency o of illumination can be arbitrarily changed without wasting light. Additionally in this optical system, since the entrance plane of the rod lens group 500 coincides with the position of the Keller illumination for uniformly illuminating the entrance plane of the rod lens group 500, a reticle, i.e., an object to be exposed, can be more uniformly illuminated.

Figure 36:
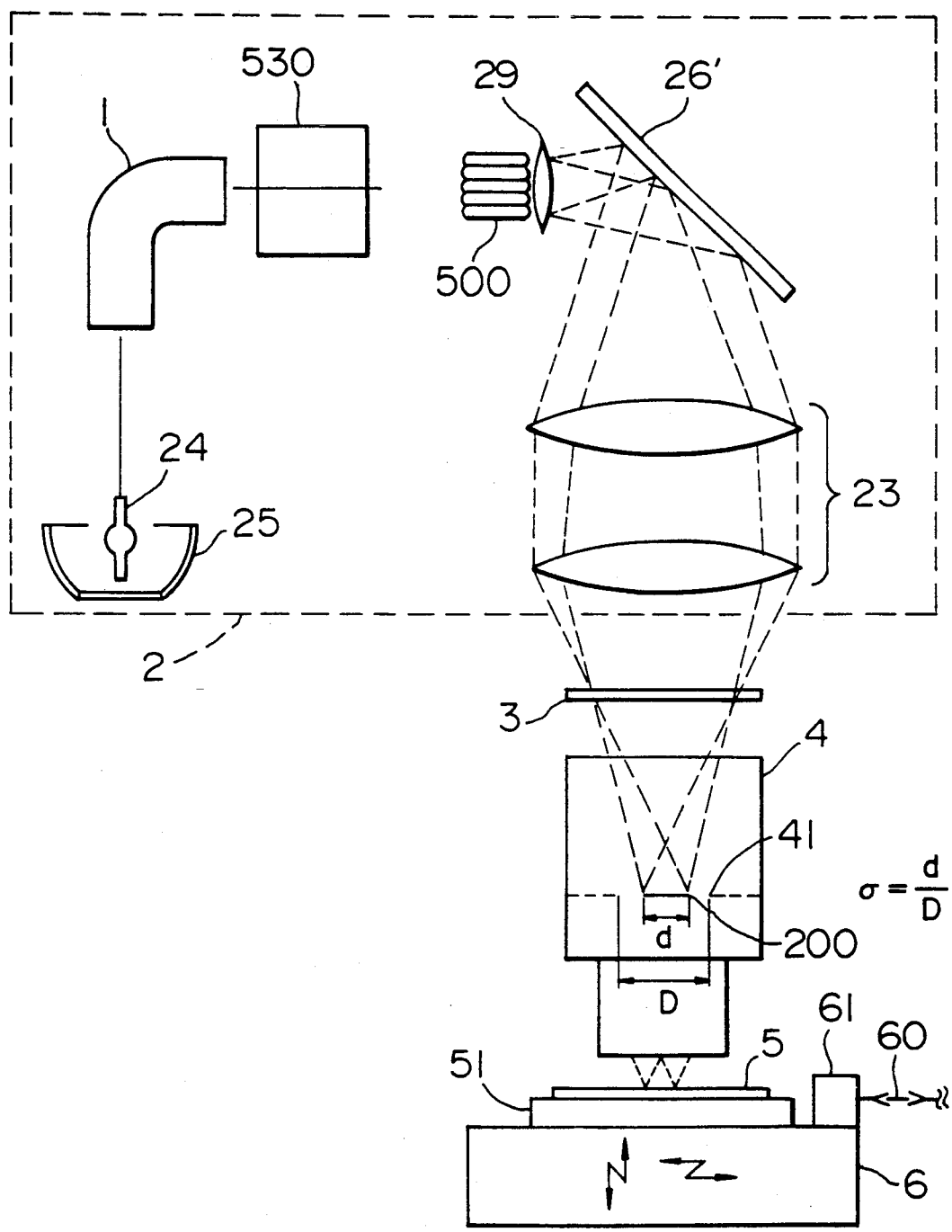
FIG. 36 illustrates a projection exposure apparatus which comprises the illumination modifying means based on the second embodiment of the present invention.

FIG. 36 illustrates an embodiment of a projection exposure apparatus which is provided with the zoom lens mechanism 530 mounted therein. A light beam, for example, an i-line emitted from a mercury lamp 24 enters into an optical fiber bundle 1, exits from an outgoing plane thereof, is refracted by the zoom lens mechanism 530 to be incident to the rod lens group 500. The zoom lens mechanism 530 acts to modify the shape of a secondary light source formed in the vicinity of the outgoing plane of the rod lens group 500. By operating the zoom lens mechanism 530, it is possible to arbitrarily set the partial coherency $\sigma$ of illumination represented by the ratio of the diameter d of a secondary light source image 200 formed at the position of an entrance pupil 41 of a reduction projection lens 4 to the diameter D of the entrance pupil 41.

Incidentally, although the foregoing embodiments have shown that a light beam emitted from the mercury lamp 24 as a light source is reflected by the elliptical mirror 25, and a desired exposing light wavelength, for example, that of i-line is reflected by the chromatic mirror 26 for selecting wave band, the present invention is not limited to such a light source but may comprise, for example, an excimer laser light source.

In the foregoing embodiments, explanation has been given of a reduction exposure apparatus to which the illumination system of the present invention is applied, however, the application of the present invention is not limited to this kind of apparatus. Specifically, the present invention can be widely applied, for example, to exposure apparatus for large-screen liquid crystal television displays, pattern testing apparatus, or a variety of display apparatus which obtain an appropriate illumination directivity or appropriate illuminance distribution by changing a secondary light source of an illuminating light beam to perform exposure, testing, display and so on. Also in some cases, it may be applied to apparatus which do not have an imaging system for performing exposure (proximity exposure), detection, display and so.

As described above, the present invention produces effects of realizing a desired illumination directivity or illumination light distribution without degrading the light utilizing efficiency.

Also, the present invention enables the directivity of a light beam to be changed without wasting light while maintaining a uniform illuminance distribution, whereby appropriate illumination can be efficiently realized for a variety of patterns to be processed by a single exposure apparatus, a testing apparatus or a display apparatus. This leads to largely improving the resolving performance of such an exposure apparatus, a testing apparatus or a display apparatus as well as reducing the power of a light source employed in these apparatus and enhancing a high throughput in the exposure apparatus and the testing apparatus.

We claim:

1. A projection exposure apparatus comprising:
   a light source for emitting a light beam for exposure;
   an illumination optical system comprising optical fiber bundle portion including a plurality of bundled optical fibers having an entrance plane to which a light beam emitted from said exposing light source is incident, and a little optical fiber bundle portion including a plurality of little optical fiber bundles respectively having an outgoing plane; and
   a projection exposure system for projecting a light beam passing through said illumination optical system and transmitting a mask or a reticle onto an object to be exposed as a pattern image of the mask or the reticle.

2. A projection exposure apparatus according to claim 1, further comprising control means for controlling relative positions of the outgoing planes of said little optical fiber bundles.

3. A projection exposure apparatus according to claim 1, further comprising a converging optical system for converging a light beam emitted from said exposing light source on the entrance side of the optical fibers in said illumination optical system.

4. A projection exposure apparatus according to claim 1, further comprising a mirror on the entrance side of the optical fibers in said illumination optical system.

5. A projection exposure apparatus according to claim 3, wherein said mirror is formed of a cylindrical mirror.

6. A projection exposure apparatus according to claim 1, wherein said converging optical system of said illumination optical system has an optical element for inputting a ring-shaped light beam on the entrance plane of said optical fiber bundle portion.

7. A projection exposure apparatus according to claim 1, wherein said exposing light source comprises a laser light source.

8. A projection exposure apparatus according to claim 1, wherein at least part of the entrance plane of the optical fiber bundle portion in said illumination optical system comprises a plurality of segments, wherein incident angles of the respective segments are different from each other with respect to the incident direction of a light beam, thereby providing a desired directivity to light beams exiting from the outgoing planes of the little optical fiber bundles.

9. A projection exposure apparatus according to claim 1 or 7, wherein optical path lengths of the optical fibers in said illumination optical system are made different to reduce the coherency of an illuminating light beam.

10. An illumination method comprising the steps of:
converging a light beam emitted from a light source;
passing the converged light beam through an optical fiber bundle formed by a plurality of optical fibers;
branching the light beam and passing the branched light beams through a plurality of branched little optical fiber bundles each having a little optical fiber bundle; and
emitting the light beams from respective outgoing planes of the plurality of little optical fiber bundles, the relative positions of which are controllable.

11. An illumination apparatus comprising:
an illuminating light source;
a converging optical system for converging the illuminating light emitted from said light source into a desired area;
optical fiber means comprising an optical fibre bundle portion to which the illuminating light converged by said converging optical system is incident and a plurality of little fiber bundle portions branched from said optical fiber bundle portion; and
control means for controlling relative positions of outgoing planes of the little optical fiber bundle portions of said optical fibers.

12. A projection exposure apparatus comprising:
an exposing light source;
an illumination optical system for irradiating a mask or a reticle with a light beam emitted from said exposing light source including:
optical fiber means comprising an optical fiber bundle portion including a plurality of optical fibers and having an entrance plane from which a light beam emitted from said exposing light source enters, and a little optical fiber bundle portion including a plurality of little optical fiber bundles each having an outgoing plane; and
a converging and diverging optical system for converging particular angle components of an incident light beam exiting from said optical fiber means and diverging the converged components; and
a projection optical system for projecting a light beam passing through said illumination optical system and transmitting a mask or a reticle onto an object to be exposed as a pattern image of the mask or the reticle.

13. A projection exposure apparatus according to claim 12, wherein said illumination optical system further comprises control means for controlling relative positions of the outgoing planes of said little optical fiber bundle portion.

14. A projection exposure apparatus according to claim 12, wherein the outgoing end of the optical fiber means in said illumination optical system is in an optically conjugated relationship with the entrance plane of said converging and diverging optical system.

15. A projection exposure apparatus according to claim 12, further comprising optically modifying means for modifying a light beam incident to said optical fiber means in said illumination optical system by refraction or reflection.

16. A projection exposure apparatus according to claim 12, further comprising optically modifying means for modifying a light beam incident to said converging and diverging optical system in said illumination optical system by refraction or reflection.

17. A projection exposure apparatus according to claim 15, wherein said optical fiber means has such a numerical aperture that an illuminating light beam having an inclination modified by the optically modifying means can sufficiently transmit said converging and diverging optical system.

18. A projection exposure apparatus according to claim 16, wherein said optical fiber means has such a numerical aperture that an illuminating light beam having an inclination modified by the optically modifying means can sufficiently transmit said converging and diverging optical system.

19. A projection exposure apparatus according to claim 12, further comprising optical means for establishing the relationship of Keller illumination or optical infinity between the outgoing plane of said optical fiber means in said illumination optical system and the entrance plane of said converging and diverging optical system.

20. A projection exposure apparatus according to claim 19, further comprising modifying means for modifying the diameter of light beams exiting from said optical fiber means in said illumination optical system to lead the light beam into said converging and diverging optical system.

21. A projection exposure apparatus according to claim 19, further comprising optically modifying means for modifying a light beam incident to said converging and diverging optical system in said illumination optical system by refraction or reflection.

22. A projection exposure apparatus according to claim 12, 13, 14, 16, 18, 19, 20 or 21, wherein said converging and diverging optical system is formed by a rod lens.

23. A projection exposure method comprising the steps of:
leading a light beam emitted from an exposing light source into an entrance plane of optical fiber means including an optical fiber bundle portion formed by a plurality of bundled optical fibers having said entrance plane, and a little optical fiber bundle portion formed by a plurality of little optical fiber bundles branched from said optical fiber bundle portion and each having an outgoing plane;
converging particular angle components of light beams exiting from said outgoing planes of said optical fiber means and diverging the converged components by a converging and diverging optical system, and irradiating a mask or a reticle with the light beam through said converging and diverging optical system; and
projecting the light beam transmitting the mask or the reticle onto an object to be exposed as a pattern image of the mask or the reticle.

24. An illumination optical apparatus comprising:
a light source;
optical fiber means including an optical fiber bundle portion formed by a plurality of bundles optical fibers having an entrance plane to which a light beam emitted from said light source is incident, and a little optical fiber bundle portion formed by a plurality of little optical fiber bundles branched from said optical fiber bundle portion and each having an outgoing plane; and
a converging and diverging optical system for converging particular angle components of a light beam exiting from said optical fiber means and entering thereinto and diverging the converged components.

25. An illumination optical apparatus according to claim 24, further comprising control means for controlling relative positions of the outgoing planes of said little optical fiber bundle portion.

26. An illumination optical apparatus according to claim 24, wherein the outgoing end of said optical fiber means and the entrance plane of said converging and diverging optical system are in an optically conjugated relationship.

27. An illumination optical apparatus according to claim 24, further comprising optically modifying means for modifying a light beam entering into said optical fiber means by refraction or reflection.

28. An illumination optical apparatus according to claim 24, further comprising optical modifying means for modifying a light beam entering into said converging and diverging optical system.

29. An illumination optical apparatus according to claim 24 further comprising optical means for establishing the relationship of Keller illumination or optical infinity between the outgoing plane of said optical fiber means in said illumination optical system and the entrance plane of said converging and diverging optical system.

30. An illumination optical apparatus according to claim 29, further comprising modifying means for modifying the diameter of a light beam exiting from said optical fiber means to pass the light beam into said converging and diverging optical system.

31. An illumination optical apparatus according to claim 29, further comprising optically modifying means for modifying a light beam incident to said converging and diverging optical system by refraction or reflection.

32. A projection exposure apparatus according to claim 24, wherein said converging and diverging optical system is formed by a rod lens.

* * * * *